(12) United States Patent
Fork et al.

(10) Patent No.: US 8,399,283 B2
(45) Date of Patent: Mar. 19, 2013

(54) BIFACIAL CELL WITH EXTRUDED GRIDLINE METALLIZATION

(75) Inventors: David K. Fork, Los Altos, CA (US); Stephen Patrick Shea, Savannah, GA (US)

(73) Assignee: SolarWorld Innovations GmbH, Freiburg (DE)

( * ) Notice: Subject to any disclaimer, the term of this patent is extended or adjusted under 35 U.S.C. 154(b) by 851 days.

(21) Appl. No.: 12/476,228

(22) Filed: Jun. 1, 2009

(65) Prior Publication Data

US 2009/0239332 A1  Sep. 24, 2009

Related U.S. Application Data

(60) Division of application No. 11/416,707, filed on May 3, 2006, now abandoned, and a continuation-in-part of application No. 11/336,714, filed on Jan. 20, 2006, now abandoned.

(51) Int. Cl.
*H01L 31/042* (2006.01)
(52) U.S. Cl. ............... 438/72; 438/71; 438/98; 136/256
(58) Field of Classification Search .................. None
See application file for complete search history.

(56) References Cited

U.S. PATENT DOCUMENTS

| | | |
|---|---|---|
| 2,031,387 A | 2/1936 | Schwarz |
| 2,326,803 A | 8/1943 | Samiran |
| 2,761,791 A | 9/1956 | Russell et al. |
| 2,789,731 A | 4/1957 | Marraffino |
| 3,032,008 A | 5/1962 | Land et al. |
| 3,159,313 A | 12/1964 | Guilford |
| 3,602,193 A | 8/1971 | Adams et al. |
| 3,973,994 A | 8/1976 | Redfield |
| 3,988,166 A | 10/1976 | Beam |
| 4,018,367 A | 4/1977 | Morine et al. |
| 4,021,267 A | 5/1977 | Dettling |
| 4,045,246 A | 8/1977 | Mlavsky et al. |
| 4,053,327 A | 10/1977 | Meulenberg, Jr. |
| 4,084,985 A | 4/1978 | Evans, Jr. |
| 4,086,485 A | 4/1978 | Kaplow et al. |
| 4,095,997 A | 6/1978 | Griffiths |
| 4,104,091 A | 8/1978 | Evans, Jr. et al. |
| 4,119,058 A | 10/1978 | Schmermund |
| 4,131,485 A | 12/1978 | Meinel et al. |
| 4,141,231 A | 2/1979 | Kudlich |
| 4,148,301 A | 4/1979 | Cluff |
| 4,153,476 A | 5/1979 | Shelpuk |
| 4,177,083 A | 12/1979 | Kennedy |

(Continued)

FOREIGN PATENT DOCUMENTS

| | | |
|---|---|---|
| CN | 1346517 A | 4/2002 |
| CN | 2606309 Y | 3/2004 |

(Continued)

OTHER PUBLICATIONS

U.S. Appl. No. 11/282,882, filed Nov. 17, 2005, Fork et al.

(Continued)

*Primary Examiner* — Zandra Smith
*Assistant Examiner* — Pamela E Perkins

(57) ABSTRACT

Provided is a bifacial photovoltaic arrangement comprising a bifacial cell which included a semiconductor layer having a first surface and a second surface, a first passivation layer formed on the first surface of the semiconductor layer and a second passivation layer formed on the second surface of the semiconductor layer, and a plurality of metallizations formed on the first and second passivation layers and selectively connected to the semiconductor layer. At least some of the metallizations on the bifacial photovoltaic arrangement comprising an elongated metal structure having a relatively small width and a relatively large height extending upward from the first and second passivation layers.

20 Claims, 11 Drawing Sheets

U.S. PATENT DOCUMENTS

| | | |
|---|---|---|
| 4,205,216 A | 5/1980 | Douglas |
| 4,221,468 A | 9/1980 | Macken |
| 4,223,202 A | 9/1980 | Peters et al. |
| 4,224,081 A | 9/1980 | Kawamura et al. |
| 4,254,894 A | 3/1981 | Fetters |
| 4,331,703 A | 5/1982 | Lindmayer |
| 4,337,758 A | 7/1982 | Meinel et al. |
| 4,355,196 A | 10/1982 | Chai |
| 4,461,403 A | 7/1984 | Prahs |
| 4,476,165 A | 10/1984 | McIntyre |
| 4,479,027 A | 10/1984 | Todorof |
| 4,490,418 A | 12/1984 | Yoshida |
| 4,521,457 A | 6/1985 | Russell et al. |
| 4,533,814 A | 8/1985 | Ward |
| 4,540,843 A | 9/1985 | Gochermann et al. |
| 4,589,191 A | 5/1986 | Green et al. |
| 4,602,120 A | 7/1986 | Wakefield et al. |
| 4,609,037 A | 9/1986 | Wheeler et al. |
| 4,683,348 A | 7/1987 | Pidgeon et al. |
| 4,746,370 A | 5/1988 | Woolf |
| 4,747,517 A | 5/1988 | Hart |
| 4,792,685 A | 12/1988 | Yamakawa |
| 4,796,038 A | 1/1989 | Allen et al. |
| 4,826,777 A | 5/1989 | Ondris |
| 4,841,946 A | 6/1989 | Marks |
| 4,847,349 A | 7/1989 | Ohta et al. |
| 4,849,028 A | 7/1989 | Krause |
| 4,855,884 A | 8/1989 | Richardson |
| 4,896,015 A | 1/1990 | Taboada et al. |
| 4,933,623 A | 6/1990 | Fox |
| 4,938,994 A | 7/1990 | Choinski |
| 4,947,825 A | 8/1990 | Moriarty |
| 4,952,026 A | 8/1990 | Bellman et al. |
| 4,976,999 A | 12/1990 | Ishizuka |
| 4,985,715 A | 1/1991 | Cyphert et al. |
| 4,996,405 A | 2/1991 | Poumey et al. |
| 5,000,988 A | 3/1991 | Inoue et al. |
| 5,004,319 A | 4/1991 | Smither |
| 5,011,565 A | 4/1991 | Dube et al. |
| 5,062,899 A | 11/1991 | Kruer |
| 5,075,281 A | 12/1991 | Testardi |
| 5,089,055 A | 2/1992 | Nakamura |
| 5,151,377 A | 9/1992 | Hanoka et al. |
| 5,167,724 A | 12/1992 | Chiang |
| 5,180,441 A | 1/1993 | Cornwall et al. |
| 5,188,789 A | 2/1993 | Nishiura |
| 5,213,628 A | 5/1993 | Noguchi et al. |
| 5,216,543 A | 6/1993 | Calhoun |
| 5,254,388 A | 10/1993 | Melby et al. |
| 5,279,682 A | 1/1994 | Wald et al. |
| 5,344,496 A | 9/1994 | Stern et al. |
| 5,353,813 A | 10/1994 | Deevi et al. |
| 5,356,488 A | 10/1994 | Hezel |
| 5,389,159 A | 2/1995 | Kataoka et al. |
| 5,449,413 A | 9/1995 | Beauchamp et al. |
| 5,501,743 A | 3/1996 | Cherney |
| 5,529,054 A | 6/1996 | Shoen |
| 5,536,313 A | 7/1996 | Watanabe et al. |
| 5,538,563 A | 7/1996 | Finkl |
| 5,540,216 A | 7/1996 | Rasmusson |
| 5,543,333 A | 8/1996 | Holdermann |
| 5,552,820 A | 9/1996 | Genovese |
| 5,559,677 A | 9/1996 | Errichiello |
| 5,560,518 A | 10/1996 | Catterall et al. |
| 5,569,399 A | 10/1996 | Penney et al. |
| 5,590,818 A | 1/1997 | Raba et al. |
| 5,665,175 A | 9/1997 | Safir |
| 5,700,325 A | 12/1997 | Watanabe |
| 5,733,608 A | 3/1998 | Kessel et al. |
| 5,751,436 A | 5/1998 | Kwon et al. |
| 5,873,495 A | 2/1999 | Saint-Germain |
| 5,913,147 A | 6/1999 | Dubin et al. |
| 5,916,461 A | 6/1999 | Costin et al. |
| 5,918,771 A | 7/1999 | van der Heijden |
| 5,929,530 A | 7/1999 | Stone |
| 5,949,123 A | 9/1999 | Le et al. |
| 5,981,902 A | 11/1999 | Arita et al. |
| 5,990,413 A | 11/1999 | Ortabasi |
| 6,008,449 A | 12/1999 | Cole |
| 6,011,307 A | 1/2000 | Jiang et al. |
| 6,020,554 A | 2/2000 | Kaminar et al. |
| 6,032,997 A | 3/2000 | Elliott et al. |
| 6,047,862 A | 4/2000 | Davies |
| 6,091,017 A | 7/2000 | Stern |
| 6,118,067 A | 9/2000 | Lashley et al. |
| 6,121,542 A | 9/2000 | Shiotsuka et al. |
| 6,130,465 A | 10/2000 | Cole |
| 6,140,570 A | 10/2000 | Kariya |
| 6,164,633 A | 12/2000 | Mulligan et al. |
| 6,180,869 B1 | 1/2001 | Meier et al. |
| 6,183,186 B1 | 2/2001 | Howells et al. |
| 6,203,621 B1 | 3/2001 | Tran et al. |
| 6,232,217 B1 | 5/2001 | Ang et al. |
| 6,257,450 B1 | 7/2001 | Jackson et al. |
| 6,274,508 B1 | 8/2001 | Jacobsen et al. |
| 6,278,054 B1 | 8/2001 | Ho et al. |
| 6,293,498 B1 | 9/2001 | Stanko et al. |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,379,521 B1 | 4/2002 | Nishio |
| 6,398,370 B1 | 6/2002 | Chiu et al. |
| 6,407,329 B1 | 6/2002 | Iino et al. |
| 6,410,843 B1 | 6/2002 | Kishi et al. |
| 6,413,113 B2 | 7/2002 | Uher et al. |
| 6,418,986 B1 | 7/2002 | Gabriele |
| 6,420,266 B1 | 7/2002 | Smith et al. |
| 6,423,140 B1 | 7/2002 | Liu et al. |
| 6,429,037 B1 | 8/2002 | Wenham et al. |
| 6,459,418 B1 | 10/2002 | Comiskey et al. |
| 6,479,395 B1 | 11/2002 | Smith et al. |
| 6,527,964 B1 | 3/2003 | Smith et al. |
| 6,531,653 B1 | 3/2003 | Glenn et al. |
| 6,555,739 B2 | 4/2003 | Kawam |
| 6,568,863 B2 | 5/2003 | Murata |
| 6,590,235 B2 | 7/2003 | Carey et al. |
| 6,597,510 B2 | 7/2003 | Bunkenburg et al. |
| 6,623,579 B1 | 9/2003 | Smith et al. |
| 6,663,944 B2 | 12/2003 | Park et al. |
| 6,666,165 B2 | 12/2003 | Shiraishi et al. |
| 6,667,434 B2 | 12/2003 | Morizane et al. |
| 6,743,478 B1 | 6/2004 | Kiiha et al. |
| 6,890,167 B1 | 5/2005 | Kwok et al. |
| 6,896,381 B2 | 5/2005 | Benitez et al. |
| 6,924,493 B1 | 8/2005 | Leung |
| 6,979,798 B2 | 12/2005 | Gu et al. |
| 7,002,675 B2 | 2/2006 | MacGibbon et al. |
| 7,045,794 B1 | 5/2006 | Spallas et al. |
| 7,101,592 B2 | 9/2006 | Gueggi et al. |
| 7,129,592 B1 | 10/2006 | Yetter |
| 7,152,985 B2 | 12/2006 | Benitez et al. |
| 7,160,522 B2 | 1/2007 | Minano Dominguez et al. |
| 7,181,378 B2 | 2/2007 | Benitez et al. |
| 7,388,147 B2 | 6/2008 | Mulligan et al. |
| 7,394,016 B2 | 7/2008 | Gronet |
| 2001/0008230 A1 | 7/2001 | Keicher et al. |
| 2002/0056473 A1 | 5/2002 | Chandra et al. |
| 2002/0060208 A1 | 5/2002 | Liu et al. |
| 2002/0127953 A1 | 9/2002 | Doan et al. |
| 2002/0148497 A1 | 10/2002 | Sasaoka et al. |
| 2002/0149107 A1 | 10/2002 | Chang et al. |
| 2002/0154396 A1 | 10/2002 | Overbeck |
| 2003/0015820 A1 | 1/2003 | Yamazaki et al. |
| 2003/0032214 A1* | 2/2003 | Huang ............................ 438/50 |
| 2003/0095175 A1 | 5/2003 | Agorio |
| 2003/0129810 A1 | 7/2003 | Barth et al. |
| 2003/0201581 A1 | 10/2003 | Weber et al. |
| 2003/0213429 A1 | 11/2003 | Kreuzer |
| 2003/0232174 A1 | 12/2003 | Chang et al. |
| 2004/0012676 A1 | 1/2004 | Weiner |
| 2004/0031517 A1 | 2/2004 | Bareis |
| 2004/0048001 A1 | 3/2004 | Kiguchi et al. |
| 2004/0070855 A1 | 4/2004 | Benitez et al. |
| 2004/0084077 A1 | 5/2004 | Aylaian |
| 2004/0151014 A1 | 8/2004 | Speakman |

| | | | |
|---|---|---|---|
| 2004/0191422 A1 | 9/2004 | Kataoka | |
| 2004/0200520 A1 | 10/2004 | Mulligan et al. | |
| 2004/0211460 A1 | 10/2004 | Simburger et al. | |
| 2005/0000566 A1 | 1/2005 | Posthuma et al. | |
| 2005/0029236 A1 | 2/2005 | Gambino et al. | |
| 2005/0034751 A1 | 2/2005 | Gross et al. | |
| 2005/0046977 A1 | 3/2005 | Shifman | |
| 2005/0067729 A1 | 3/2005 | Laver et al. | |
| 2005/0081908 A1 | 4/2005 | Stewart | |
| 2005/0127541 A1 | 6/2005 | Spurgeon et al. | |
| 2005/0133084 A1 | 6/2005 | Joge et al. | |
| 2005/0194037 A1 | 9/2005 | Asai | |
| 2005/0221613 A1 | 10/2005 | Ozaki et al. | |
| 2005/0253308 A1 | 11/2005 | Sherwood | |
| 2006/0046269 A1 | 3/2006 | Thompson et al. | |
| 2006/0076105 A1 | 4/2006 | Furui et al. | |
| 2006/0207650 A1 | 9/2006 | Winston et al. | |
| 2006/0231133 A1 | 10/2006 | Fork et al. | |
| 2006/0251796 A1 | 11/2006 | Fellingham | |
| 2006/0266235 A1 | 11/2006 | Sandhu et al. | |
| 2007/0023081 A1* | 2/2007 | Johnson et al. | 136/258 |
| 2007/0186970 A1* | 8/2007 | Takahashi et al. | 136/255 |
| 2008/0041436 A1* | 2/2008 | Lau et al. | 136/244 |
| 2008/0047605 A1 | 2/2008 | Benitez et al. | |
| 2008/0138456 A1 | 6/2008 | Fork et al. | |

FOREIGN PATENT DOCUMENTS

| | | |
|---|---|---|
| CN | 1854637 A | 11/2006 |
| DE | 197 35 281 A1 | 2/1999 |
| EP | 0 257 157 A | 3/1988 |
| EP | 0 851 511 A | 7/1998 |
| EP | 1 145 797 A | 10/2001 |
| EP | 1 351 318 A | 10/2003 |
| EP | 1 715 260 A | 10/2006 |
| EP | 1 763 086 A | 3/2007 |
| EP | 1 787 786 A | 5/2007 |
| EP | 1 833 099 A | 9/2007 |
| JP | 60082680 A | 10/1985 |
| JP | 02055689 A | 2/1990 |
| JP | 02 187291 A | 7/1990 |
| JP | 9223499 A | 8/1997 |
| JP | 11076898 A | 3/1999 |
| JP | 11307791 A | 11/1999 |
| JP | 2000200799 A | 7/2000 |
| JP | 2002086047 A | 3/2002 |
| JP | 2002-111035 A | 4/2002 |
| JP | 2004006565 A | 1/2004 |
| JP | 2004174489 A | 6/2004 |
| JP | 2004-266023 A | 9/2004 |
| JP | 2004281813 A | 10/2004 |
| JP | 2005051216 | 2/2005 |
| JP | 2005116906 A | 4/2005 |
| JP | 2006100527 A | 4/2006 |
| JP | 2008266981 A | 11/2008 |
| TW | 200531822 A | 10/2005 |
| WO | WO 91/08503 A | 6/1991 |
| WO | WO 91/15355 | 10/1991 |
| WO | WO 92/15845 A | 9/1992 |
| WO | WO 94/28361 A1 | 12/1994 |
| WO | WO 97/21253 A | 6/1997 |
| WO | WO 97/48519 A | 12/1997 |
| WO | WO 00/49421 A1 | 8/2000 |
| WO | WO 00/49658 A1 | 8/2000 |
| WO | WO 00/50215 | 8/2000 |
| WO | WO 02/052250 A | 7/2002 |
| WO | WO 02/097724 A1 | 12/2002 |
| WO | WO 03/047005 A | 6/2003 |
| WO | WO 03/076701 A | 9/2003 |
| WO | WO 2005/070224 A1 | 8/2005 |
| WO | WO 2005/107957 A1 | 11/2005 |
| WO | WO 2005/107958 A1 | 11/2005 |
| WO | WO 2006/097303 A1 | 9/2006 |
| WO | WO 2007/104028 | 9/2007 |

OTHER PUBLICATIONS

U.S. Appl. No. 11/282,829, filed Nov. 17, 2005, Fork et al.
U.S. Appl. No. 11/336,714, filed Jan. 20, 2006, Fork et al.
Alvarez et al. "RXI Concentrator for 1000X Photovoltaic Energy Conversion," Proc. SPIE, vol. 3781, 30 (1999), 9 pages.
Benitez et al. "High-Concentration Mirror-Based Kohler Integrating System for Tandem Solar Cells", WCPEC2006, 4 pages.
Bett et al. "FLATCON™ and FLASHCON™ Concepts for High Concentration PV", Presented at the 19$^{th}$ European Photovoltaic Solar Energy Conf., Jun. 7-11, 2004, Paris, 4 pages.
Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.
Cuevas et al. "50 Per Cent More Output Power from an Albedo-Collecting Flat Panel Using Bifacial Solar Cells", *Solar Energy*, vol. 29, No. 5, pp. 419-420, 1982.
Finlayson et al. "$Bi_2O_3$-$Wo_3$ compounds for photocatalytic applications by solid state and viscous processing", Title from a conference scheduled for Oct. 6-7, 2004 in Munich, 8 pages.
Gordon et al. "Optical performance at the thermodynamic limit with tailored imaging designs", Applied Optics, *in press*, Dec. 2004, 16 pages.
Kenis et al. "Fabrication inside Microchannels Using Fluid Flow", Accounts of Chemical Research, vol. 33, No. 12, 2000, pp. 841-847.
Kerschaver et al. "Back-contact Solar Cells: A Review," Progress in Photovoltaics: Research and Applications, 2006, vol. 14, pp. 107-123.
Kränzl et al. "Bifacial Solar Cells on Multi-Crystalline Silicon", 15$^{th}$ International Photovoltaic Science & Engineering Conference, Shanghai, China, 2 pages, 2005.
Mueller et al. "Breathable Polymer Films Produced by the Microlayer Coextrusion Process", Journal of Applied Polymer Science, vol. 78, pp. 816-828, 2000.
Mulligan et al. "A Flat-Plate Concentrator: Micro-Concentrator Design Overview", 2000 IEEE, pp. 1495-1497.
Mulligan et al. "Development of Chip-Size Silicon Solar Cells," IEEE Photovoltaic Specialists Conference, 2000, pp. 158-163.
Neuhaus et al. "Industrial Silicon Wafer Solar Cells," Advances in OptoElectronics, vol. 2007, 2007, 15 pages.
Nguyen, Luu "Wafer Level Packaging for Analog/Mixed Signal Applications", MEPTEC Int. Wafer Level Packaging Conference, Aug. 22, 2002, 41 pages.
Rao et al. "Microfabricated Deposition Nozzles for Direct-Write Assembly of Three-Dimensional Periodic Structures", *Advanced Materials*, vol. 17, No. 3, Feb. 10, 2005, 5 pages.
Recart et al. "Large Area Thin BSF Solar Cells With Simultaneously Diffused Boron and Phosphorus Screen Printed Emitters", IEEE, pp. 1213-1216, 2005.
Sun et al. "Modeling and Experimental Evaluation of Passive Heat Sinks for Miniature High-Flux Photovoltaic Concentrators", Transactions of the ASME, vol. 127, pp. 138-145 (2005).
Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.
Swanson, Richard M. "The Promise of Concentrators", *Prog. Photovolt. Res. Appl.* 8, pp. 93-111 (2000).
Taguchi et al. An Approach for the Higher Efficiency in the HIT Cells, IEEE, pp. 866-871, 2005.
Terao et al. "A Mirror-Less Design for Micro-Concentrator Modules", Conference Record of the 28$^{th}$ IEEE Photovoltaic Specialists Conference (2000) pp. 1416-1419.
Terao, Akira "MicroDish: A Novel Reflective Optic for Flat-Plate Micro-Concentrator", SPIE's 49$^{th}$ Annual Meeting, Aug. 2-6, 2004, Denver, Colorado, USA, 9 pages.
Van Hoy et al. "Microfabrication of Ceramics by Co-extrusion", *J. Am. Ceram. Soc.*, vol. 81, No. 1, pp. 152-158, 1998.
Weber et al. "Modelling of Sliver® Modules Incorporating a Lambertian Rear Reflector", The Australian National University, Canberra ACT 0200, Australia, 4 pages, 2005.
Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.
Extrusion/Coextrusion Dies, Extrusion Dies Industries, LLC, http://www.extrusiondies.com/PRODUCTS/ExtrusionDies/multimanifoldDies.html, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

SunPower Corp. News Release, May 12, 2008, Available URL: http://investors.sunpowercorp.com/releasedetail.cfm?ReleaseID=309613.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

Sparber et al. "Comparison of texturing methods for monocrystalline silicon solar cells using KOH and $Na_2CO_3$," $3^{rd}$ World Conf. Photovoltaic Energy Conversion, Osaka, 2003, pp. 1372-1375.

MacDonald et al. "Texturing industrial multicrystalline silicon solar cells," Solar Energy, vol. 76, 2004, pp. 277-283.

Tool et al. "Straightforward in-line processing for 16.8% efficient mc-Si solar cells," $31^{st}$ IEEE Photovoltaic Specialists Conf., Florida, 2005, pp. 1324-1327.

Fukui et al. "17.7% efficiency large area multicrystalline silicon solar cell using screen-printed metallization technique," $31^{st}$ IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/me10705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Murphy, Jr. "Home photovoltaic systems for physicists," Physics Today, Jul. 2008, pp. 42-47.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "Buried Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells", Oct. 1999, IEEE Transactions on Electron Devices, vol. 46, No. 10, pp. 2055-2061.

Knight et al. "Hydrodynamic Focusing on a Silicon Chip: Mixing Nanoliters in Microseconds", Physical Review Letters, vol. 80, No. 17, Apr. 27, 1998, pp. 3863-3866.

Raabe et al. "High Aspect Ratio Screen Printed Fingers", 20th European Solar Energy Conference and Exhibition, Barcelona, Spain, Jun. 6-10, 2005, 4 pgs.

Bejan, Adrian "Chapter Five, Buckling Flows: A New Frontier in Fluid Mechanics", Annual Review of Numerical Fluid Mechanics and Heat Transfer, vol. 1, Ed. T. C. Chawla, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Szlufcik et al. "Low-Cost Industrial Technologies of Crystalline Silicon Solar Cells", Proc. of the IEEE, vol. 85, No. 5, May 1, 1997, pp. 711-730.

Ruthe et al. "Etching of CuInSe2 Thin Films-Comparison of Femtosecond and Picosecond Laser Ablation", Applied Surface Science, vol. 247, No. 1-4, Jul. 15, 2005, pp. 447-452.

English Language Abstract for JP 11307791 A. Nov. 5, 1999.
English Language Abstract for JP 2004281813 A. Oct. 10, 2004.
English Language Abstract for JP 2000200799 A. Jul. 18, 2000.
English Language Abstract for JP 2004006565 A. Jan. 8, 2004.
English Language Abstract for JP 2006100527 A. Apr. 13, 2006.
English Language Abstract for JP 9223499 A. Aug. 26, 1997.
English Language Abstract for JP 2008266981 A. Nov. 6, 2008.
English Language Abstract for JP 2002086047 A. Mar. 26, 2002.
English Language Abstract for JP 11076898 A. Mar. 23, 1999.
English Language Abstract for JP 2004174489 A. Jun. 24, 2004.

* cited by examiner

BIFACIAL CELL WITH EXTRUDED GRIDLINE METALLIZATION

RELATED APPLICATIONS

This application is a Divisional of U.S. patent application Ser. No. 11/416,707, filed May 3, 2006, which is a Continuation-in-Part of U.S. patent application Ser. No. 11/336,714, filed on Jan. 20, 2006, by David K. Fork et al., and entitled "Solar Cell Production Using Non-Contact Patterning and Direct-Write Metallization"; U.S. patent application Ser. No. 11/282,882, filed on Nov. 17, 2005, by David K. Fork et al., and entitled, "Extrusion/Dispensing Systems and Methods"; and U.S. patent application Ser. No. 11/282,829, filed on Nov. 17, 2005, by David K. Fork et al., and entitled, "Extrusion/Dispensing Systems and Methods," each of which are hereby incorporated by reference in their entireties.

BACKGROUND

This application relates to the conversion of light irradiation to electrical energy, and more particularly, to methods and tools for producing bifacial photovoltaic devices (e.g., bifacial solar cells) and arrangements of bifacial devices (e.g., bifacial solar cell modules) that convert solar energy to electrical energy.

Solar cells are typically photovoltaic devices that convert sunlight directly into electricity. Solar cells commonly include a semiconductor (e.g., silicon) that absorbs light irradiation (e.g., sunlight) in a way that creates free electrons, which in turn are caused to flow in the presence of a built-in field to create direct current (DC) power. The DC power generated by several PV cells may be collected on a grid placed on the cell. Current from multiple PV cells is then combined by series and parallel combinations into higher currents and voltages. The DC power thus collected may then be sent over wires, often many dozens or even hundreds of wires.

Presently, the majority of solar cells are manufactured using a screen printed process which screen prints front and back contacts. The back contact is commonly provided as a layer of aluminum. The aluminum layer will cover most if not all the back layer of the silicon wafer, thereby blocking any light which would reflect onto the back surface of the silicon wafer. These types of solar cells therefore receive and convert sunlight only from the front exposed surface.

However, another type of known solar cell is a bifacial solar cell, which acquires light from both surfaces of the solar cell and converts the light into electrical energy. Solar cells which are capable of receiving light on both surfaces are available on the market. One example is the HIT solar cell from Sanyo Corporation of Japan, as well as bifacial solar cells sold by Hitachi Corporation, also of Japan.

Drawbacks with existing bifacial solar cells include those related to the manufacturing processes. Various ones of these drawbacks are similar to those drawbacks existing in the manufacture of single-sided solar cells, such as discussed, for example, in U.S. patent application Ser. No. 11/336,714, previously incorporated herein by reference. As discussed in that document, desired but largely unavailable features in a wafer-processing tool for making solar cells are as follows: (a) never breaks a wafer—e.g. non contact; (b) one second processing time (i.e., 3600 wafers/hour); (c) large process window; and (d) 24/7 operation other than scheduled maintenance less than one time per week. The desired but largely unavailable features in a low-cost metal semiconductor contact for solar cells are as follows: (a) Minimal contact area—to avoid surface recombination; (b) Shallow contact depth—to avoid shunting or otherwise damaging the cell's pn junction; (c) Low contact resistance to lightly doped silicon; and (d) High aspect metal features (to avoid grid shading while providing low resistance to current flow).

It is particularly desirable to provide feature placement with high accuracy for feature sizes below 100 microns. By minimizing the feature sizes, more surface area is available for the accumulation and conversion of solar light. Features on the order of 10 microns or smaller can suffice for extracting current. For a given density of features, such a size reduction may reduce the total metal-semiconductor interface area and its associated carrier recombination by a factor of 100.

Further, a major cost in solar cell production is that of the silicon layer itself. Therefore, the use of thinner layers is desirable as one way of reducing costs associated with the manufacture of solar cells. However, with existing technology, the manufacture of thin crystalline (silicon) layers (e.g., 150 microns or less) is not commercially feasible, if not impossible, due to the previously mentioned unavailable features, and because the contact layers such as silver, aluminum, etc., cause the semiconductor layers to warp or bow.

In addition, such thin devices in general have a problem that not all light is absorbed by the thin cell. To reach high efficiency using a thin silicon layer, cells require a design which permits a higher percentage of the light to be absorbed. Ideally, a high efficiency thin cell of any material in construction will accept light incident on it from either side with minimal loss, and then trap the useful portion of the solar spectrum so that it is absorbed to create photovoltaic energy.

SUMMARY

Provided is a bifacial photovoltaic arrangement which includes a semiconductor layer having a first surface and a second surface. A first passivation layer is formed on the first surface of the semiconductor layer, and a second passivation layer is formed on the second surface of the semiconductor layer. A plurality of metallizations are formed on the first and second passivation layers and are selectively connected to the semiconductor layer. At least some of the metallizations include an elongated metal structure having a relatively small width and a relatively large height extending upward from the first and second passivation layers In accordance with another aspect of the present application, a bifacial photovoltaic arrangement includes a bifacial cell having a semiconductor layer with a first surface and a second surface, and a thickness of about 150 microns or less. A first passivation layer is formed on the first surface of the semiconductor layer, and a second passivation layer is formed on a second surface of the semiconductor layer. A plurality of metallizations are formed on the first and second passivation layers, and selectively connect to the semiconductor layer. The metallizations on the first passivation layer and metallizations on the second passivation layer have sufficiently similar mechanical moments to maintain the semiconductor layer un-warped.

In accordance with a further aspect of the present application, a method is provided for producing a bifacial photovoltaic device. The method includes forming a blanket passivation layer on each of a first surface and a second surface of a semiconductor layer. A direct-write metallization apparatus arrangement is utilized to deposit the conductive lines to contact the doped regions of the semiconductor region.

BRIEF DESCRIPTION OF THE DRAWINGS

These and other features, aspects and advantages of the present application will become better understood with regard to the following description, appended claims, and accompanying drawings, where:

DETAILED DESCRIPTION

The present application relates to improvements in bifacial photovoltaic devices (e.g., bifacial solar cells) and bifacial photovoltaic arrangements (e.g., bifacial solar cell modules) that can be used, for example, to convert solar power into electrical energy. The following description is presented to enable one of ordinary skill in the art to make and use the application as provided in the context of a particular application and its requirements. As used herein, directional terms such as "upper", "lower", "side", "front", "rear", are intended to provide relative positions for purposes of description, and are not intended to designate an absolute frame of reference.

Further, the semiconductor material described herein is at times referred to as a semiconductor layer, it is to be understood this term and its variants are intended to be broadly understood as the material used in the solar device to absorb the solar radiation for conversion into electrical energy, while the term solar device is at times called a solar cell, photovoltaic cell, photoelectric cell, among other descriptions. Therefore, use of the term semiconductor layer (and its variants) will, among other descriptions, be understood to encompass wafers as well as thin film materials used to make solar devices, including bifacial solar devices. Various modifications to the preferred embodiment will be apparent to those with skill in the art, and the general principles defined herein may be applied to other embodiments. Therefore, the present application is not intended to be limited to the particular embodiments shown and described, but is to be accorded the widest scope consistent with the principles and novel features herein disclosed.

Figure 1:
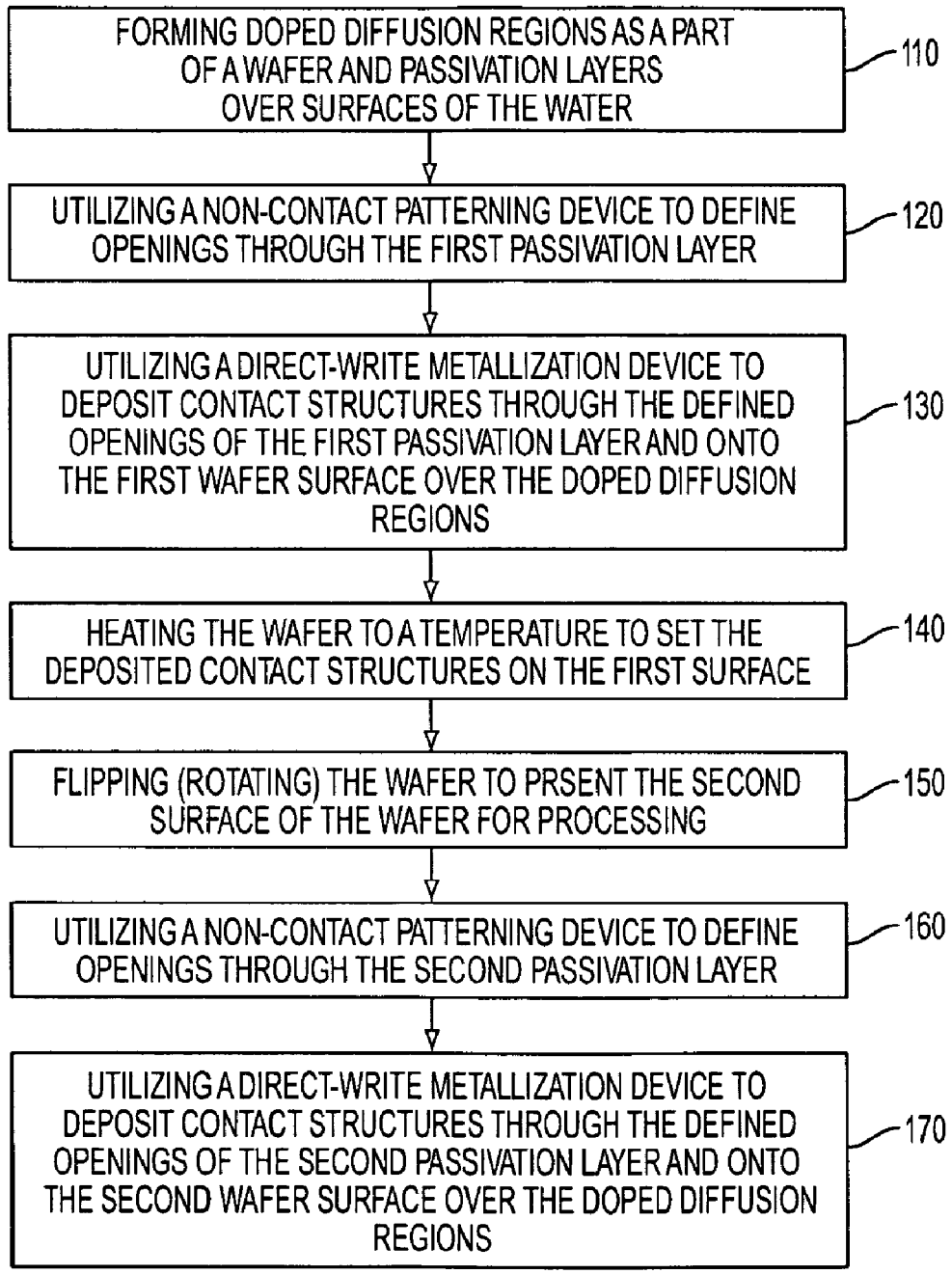
FIG. 1 is a flow diagram showing a simplified method for producing photovoltaic devices according to an embodiment of the present application.
Figure 2:
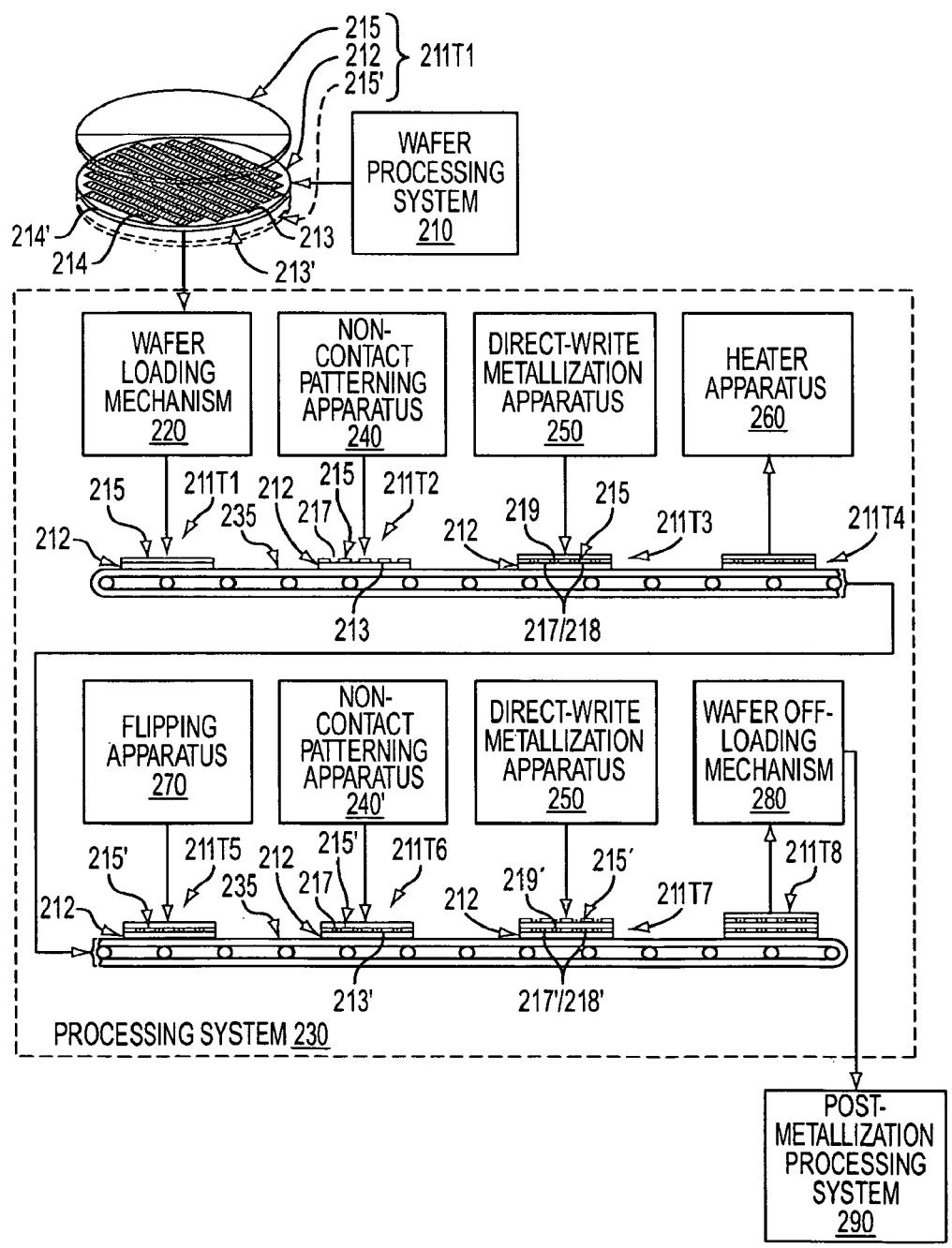
FIG. 2 is a simplified diagram showing an assembly for producing photovoltaic devices according to an embodiment of the present application.

FIG. 1 is a flow diagram indicating basic processing steps utilized to produce bifacial photovoltaic devices in accordance with an embodiment of the present application. FIG. 2 is a simplified block diagram illustrating an assembly 230 for processing photovoltaic devices using a method such as but not limited to that of FIG. 1.

The flow diagram of FIG. 1 begins with a step 110 of forming devices with doped diffusion regions of a semiconductor layer, and first and second passivation layers over the doped semiconductor regions. The formation of such devices is well known in the art. In step 120 a non-contact patterning apparatus is used to define openings through the first passivation layer on the first surface of the device. Thereafter, in step 130, a direct-write metallization apparatus is employed to deposit contact structures through the defined openings of the first passivation layer and onto the first semiconductor layer surface over the doped fusion regions. The process then moves to step 140, where the semiconductor layer is heated to a temperature sufficient to set the deposited contact structures on the first surface side. This operation is undertaken so the deposited contact structure material will not be negatively impacted when, as will be explained in the following steps, the device is flipped or rotated such that the front side of the device becomes the back side, thereby exposing the back side for processing.

More particularly, once the semiconductor layer has been heated so as to set the deposited contact structures, the process moves to step 150 where the device is flipped or rotated to present the back side for processing. In step 160 another non-contact patterning apparatus is used to define openings in the second passivation layer. Thereafter, in step 170, another direct-write metallization apparatus is used to deposit contact structures through the defined openings of the second passivation layer and onto the second semiconductor layer surface over the doped diffusion regions. Of course, the above steps may be undertaken up to step 130 or alternatively 140. In this case, a single side of the semi-conductor layer is processed, so the device can be employed as a single-sided photovoltaic (solar cell) device. At times when used as a single-sided device, the second passivation layer may not be needed.

Referring now to FIG. 2, a system to manufacture the bifacial photovoltaic devices is discussed in more detail. Particularly an upper surface 213 and lower surface 213' of a semiconductor wafer 212 has been treated to include one or more doped upper surface regions 214, and doped lower surface regions 214' (while doped regions 214' are not fully visible in FIG. 2, they are, in this embodiment configured the same as doped regions 213). Blanket passivation layer 215 is formed on the upper surface 213 over doped regions 214 and blanket passivation layer 215' is formed on the lower surface 213' over doped regions 214'. As referred to herein, the photovoltaic device is generally identified as "device 211", and at each stage of the processing cycle is referenced with an appended suffix indicating the device's current processing stage (e.g., prior to and during loading, the device is referenced as "device 211T1", with the suffix "T1" indicating a relatively early point in the process cycle). The operations used to provide device 211T1 with doped regions 214, 214' and passivation layers 215, 215' are performed using well-known processing techniques, and thus the equipment utilized to produce device 211T1 is depicted generally in FIG. 2 as wafer processing system 210.

After initial treatment, device 211T1 is transferred to an optional loading mechanism 220 of processing system (tool) 230, which loads device 211T1 onto a conveyor 235. In accordance with the present concepts, processing system 230 includes at least one non-contact patterning device 240, and at least one direct-write metallization device 250, sequentially arranged in the conveying direction of conveyor 235 (e.g., to the right in FIG. 2). As used herein, "direct-write metallization device" is defined as a device in which the metallization material is ejected, extruded, or otherwise deposited only onto the portions of the semiconductor layer where the metallization is needed (i.e., without requiring a subsequent mask and/or etching process to remove some of the metallization material). In the present application, metallizations may refer to gridlines contact portions, and/or bus bars alone or in combination as used, for example, in the configuration of solar cells. Further, a plurality of metallizations may mean a number of individual gridlines, irrespective of whether they are physically and/or electrically joined together, and/or joined to a bus bar or bus bars. Thus metallizations are not to be thought of as a blanket layer of metallization, such as for example found as the backsides of many types of single-sided solar cells.

A heater apparatus 260 may be provided when it is necessary to apply a sufficient temperature to the directly written metal material in order to set the directly written metal material such that when device 211T4 is flipped or turned, the metal material will not be smeared or otherwise negatively affected. In one embodiment, the heater apparatus may be an inductive heater, an electric heater, a microwave heater, or other appropriate heating mechanism located near conveyor 235 of processing system 230, whereby the device 211T4 is able to move past or through heater apparatus 260 without being removed from conveyor 235. To set the directly written metal material, the heater supplies a temperature based on the specific characteristics of the metal material. In many instances, the temperature necessary to set the metal material deposited by direct-write metallization apparatus 250 will be in the range of 120° C. to 140° C. However, the temperature and amount of heat applied may vary depending on the particular materials used.

In an alternative embodiment, heater apparatus 260 may be located distanced from conveyor 235, and therefore the processing system will include additional components to off-load device 211T4 to the distanced apparatus, and thereafter return device 211T4 back to the conveyor.

In another alternative embodiment, the metal bearing material may contain compounds that polymerize or otherwise stabilize mechanically (that is convert from liquid to solid) in the presence of heat or light (particularly ultraviolet light). A light source may be provided to cure a portion of the applied metal material causing it to substantially retain its shape throughout the remainder of the process flow.

With attention to still another embodiment, the direct-write metallization process may employ a hot-melt material. Such a material may come in the form of a phase charge paste, where for example, it is in a liquid state as it passes through a heated printhead, and then solidifies or freezes as it is placed into contact with a substrate. In this case, the substrate may be the passivation layers and/or surfaces of the semiconductor layer. One typical phase change paste will include wax as the hot melt material, along with the appropriate metal material.

Following setting of the metal material on device 211T5, the device is rotated or flipped by flipping apparatus 270 to place the front surface, which has been processed, face down on the conveyor 235 in order to expose the back surface for processing. Such a flipping apparatus would be well known in the art. To process the back surface of device 211T5, processing system 230 includes a second non-contact patterning apparatus 240' and a second direct-write metallization apparatus 250'. By use of these components, the second surface of device 211T6 is processed by non-contact patterning apparatus 240', and device 211T7 is processed by direct-write metallization apparatus 250', in a manner similar to that as described in connection with non-contact patterning apparatus 240 and direct-write metallization apparatus 250.

Processing system 230 also includes an optional off-loading mechanism 280 for removing processed devices 211T8 from conveyor 235 after processing by direct-write metallization apparatus 250' is completed. The removed devices are then transferred to a post-metallization processing system 290 for subsequent processing. Optional loading mechanism 220 and off-loading mechanism 280 operate in a manner well known to those skilled in the art, and therefore is not described in additional detail herein.

In an alternative embodiment, a heater apparatus similar to heater apparatus 260 may also be included in the system, following the direct-write metallization apparatus 250'. However, this heater is optional, since to fully process device 211T8, it will be heated to a temperature higher (e.g., approximately 600° C.-900° C.) than the setting temperature (e.g., 120° C. to 140° C.). Therefore, the setting of the metal material on the back surface and final heating of the entire device may be accomplished in a single step by a heater arrangement of the post-metallization processing system 290.

Of course, other process flows may be used depending on specific devices being manufactured, and the apparatuses and arrangement of apparatuses within the processing system. For example, a processing system employing the concepts of to-be-discussed FIGS. 3 and 4 would not need to employ flipping apparatus 270.

With continuing attention to processing system 230, conveyor 235 is depicted in FIG. 2 as a belt-type conveyor mechanism in which a planar belt conveys devices 211T1 to non-contact patterning devices 240, 240' and direct-write metallization devices 250, 250' with at least one side or surface of the devices in contact with the conveyor belt. The use of belt-like conveyor 235 in the depicted generalized system is intended to be exemplary and not limiting.

More particularly, and prior to continued discussion of FIGS. 1 and 2, an alternative to manufacturing the bifacial solar cells with the semiconductor layer positioned flat on conveyor 235, is to locate device 211T1 such that both the front surface and back surface are exposed at the same time to permit simultaneous, or near simultaneous operations on both surfaces. As illustrated in the side view of FIG. 3, processing system 230 may be configured with a conveyor 235a having a slot 236 into which device 211T1 is loaded. Slot 236 is sized to securely hold device 211T1 such that device 211T1 does not move back and forth, or slide, during processing. The width of slot 236 defines the amount of tension placed on device 211T1 and the depth of slot 236 is selected to permit sufficient access for complete processing. The specific width and depth of slot 236 is dependant on the material, size and thickness of device 211T1. Slot 236 may be a plurality of individual, separately defined slot areas or one continuous slot, and may be formed on top of the belt surface or manufactured within the belt.

Figure 4:
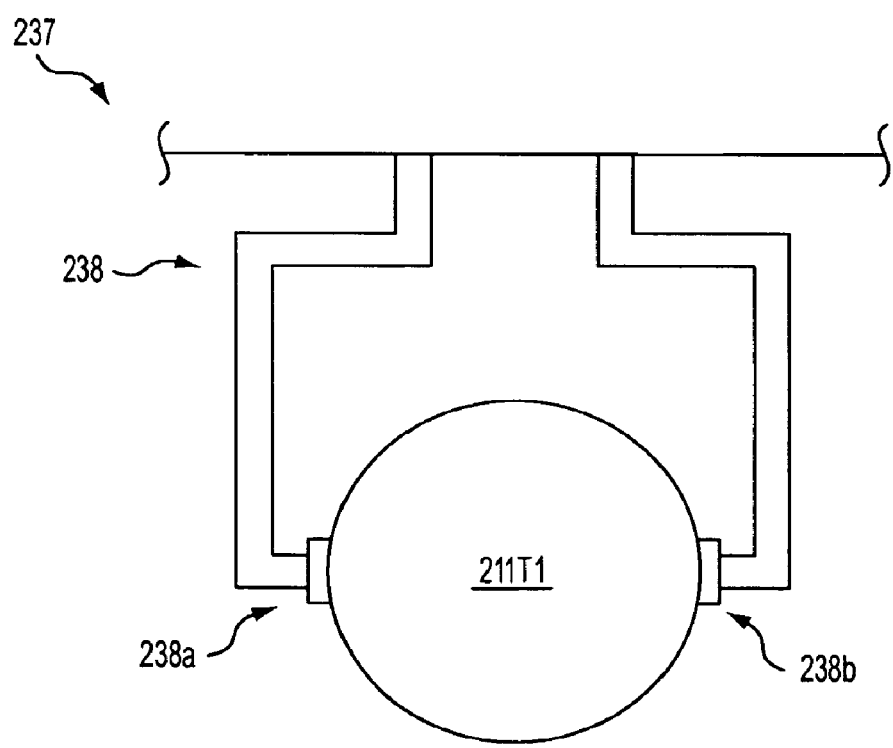
FIG. 4 depicts an overhead clamp conveyor arrangement for processing wafers in accordance with the present application.

FIG. 4 depicts a further conveyor embodiment wherein the conveyor is an overhead clamp type conveyor 237 and device 211T1 is held by an overhead clamp 238, having engaging arms 238a, 238b. The engaging arms are sufficiently sized and of appropriate tension to maintain device 211T1 steady during processing.

By positioning device 211T1 in a substantially vertical position, it is possible to undertake processing operations without the requirement of flipping device 211T1. Therefore, operations on the two sides may be done simultaneously, or sequentially. For example, non-contact patterning apparatuses 240 and 240' may be aligned across from each other on opposite sides of device 211T1 (a similar arrangement may be made with direct-write metallization apparatuses 250, 250'). In an alternative arrangement, these apparatuses may be offset from each other, such that only a single operation is being performed on either side of the surface at one time. Still further, the overhead conveyor implementation of FIG. 4 may be designed whereby the overhead clamp 238 swivels such that all of the processing apparatuses are located on a single side, and device 211T1 is rotated to be processed by the different apparatuses.

Figure 3:
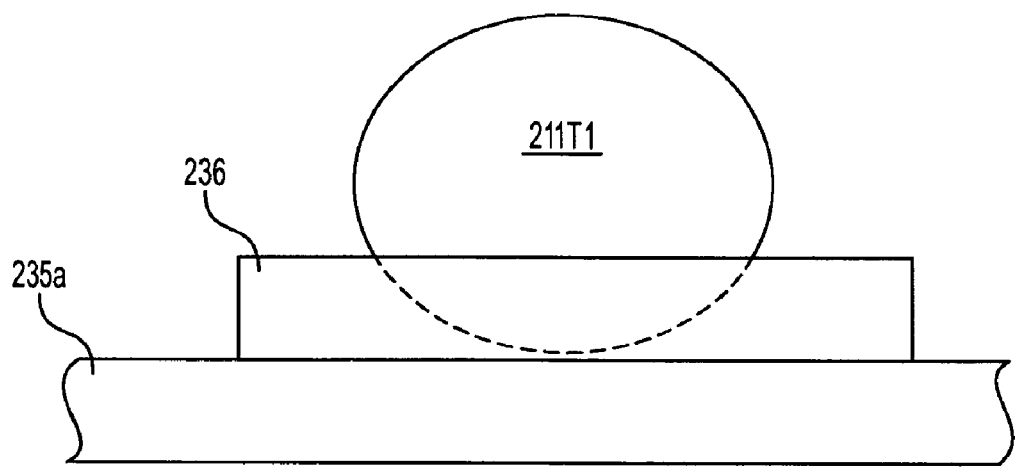
FIG. 3 depicts a slotted conveyor system to carry wafers in accordance with an embodiment of the present application.

It is to be appreciated that, while device 211T1 of FIGS. 3 and 4 is depicted in a round or circular configuration, the present concepts are equally applicable to square or pseudo-square configurations (e.g., that is round semiconductor layers that are squared-up by chopping off four edges) as known in the art, and the use of the round or circular configuration is not intended to be limiting.

Figure 5:
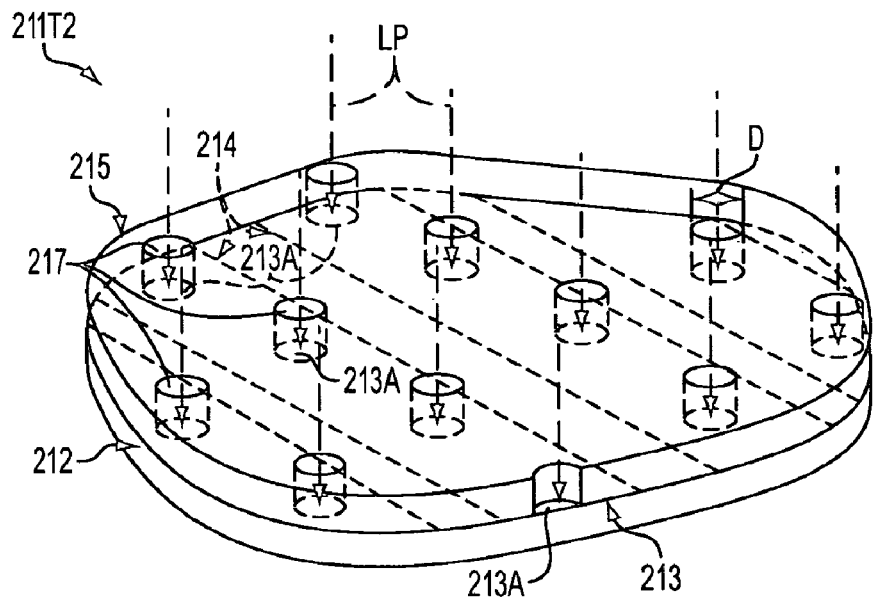
FIG. 5 is a perspective view showing a portion of a bifacial photovoltaic device during a patterning portion of the production process of FIG. 1.

Returning now to FIG. 2, non-contact patterning apparatus 240 is utilized to define a plurality of openings 217 through passivation layer 215, whereby each opening 217 exposes a corresponding one of said one or more regions on surface 213 of the semiconductor wafer 212. The results of such processing are illustrated in FIG. 5. Particularly, in accordance with a present embodiment, non-contact patterning device 240 is a laser-based ablation device capable of generating laser pulses LP of sufficient energy to ablate (remove) portions of passivation layer 215 to form openings 217 that expose surface portions 213A of substrate 212 without the need for cleaning or other processing prior to metallization. An advantage of using laser ablation, when compared to methods such as chemical etching, is that wafer 212 need not be rinsed and dried after the ablation is performed. Avoidance of rinsing and drying steps enables the rapid and successive processing of the contact opening followed by the metallization.

In an alternative embodiment, a particle-beam generating apparatus or other appropriate device which can form openings, such as openings 217, may be used in place of the laser-based patterning. It is to be appreciated that when non-contact patterning apparatus 240' processes the back side of device 211T5, a similar layout of openings 217' through passivation layer 215' will be formed on the back side of the device. For convenience of explanation, a separate figure is not provided, and as such a two-sided processing is depicted in FIG. 2.

In a further alternative embodiment, the non-contact patterning device is not a laser- or particle-beam generating device used to form the contact openings through the passivation layers. Rather, a solar paste may be used which can include a glass frit in an organic vehicle. Upon heating, the organic vehicle decomposes and the glass frit softens and then dissolves the surfaces of the passivation layers, creating a pathway to the semiconductor layer.

It is to be appreciated the embodiments used to make connections from the semiconductor layer to the metallizations, such as the contact portions, gridlines, etc. may result in situations where less than all of the intended connections are made, due, for example, to imperfect manufacturing, such as misalignment over a doped region, incomplete formation of openings, etc. Therefore, the connections may be considered to be selective connections, where this may mean all the intended connections, or some amount less than all of the intended connections, are actually made.

Figure 6:
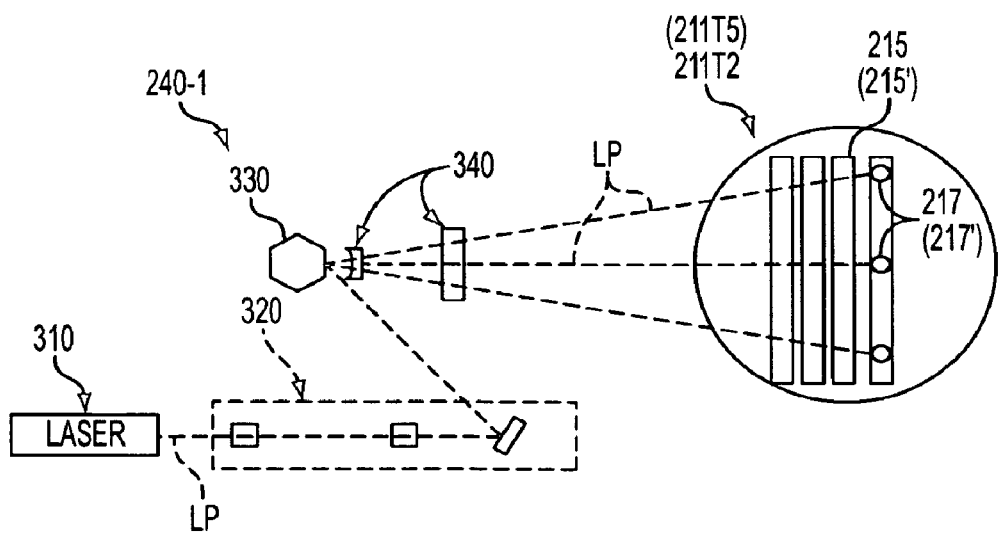
FIG. 6 is a top plan view depicting a laser-based patterning apparatus utilized in the patterning portion.

In accordance with a specific embodiment to form the above-mentioned openings 217, FIG. 6 illustrates, non-contact patterning apparatuses 240, 240' include a scanning-type laser apparatus 240-1 in which laser pulses LP generated by a laser 310 are directed by way of beam conditioning optics 320 onto a rotating mirror 330 and through a suitable scan lens 340 such that laser pulses LP are directed in a predetermined scan pattern across passivation layers 215, 215' (e.g., silicon nitride). Laser apparatus 240-1 is similar to those used for writing the electrostatic image on the photoreceptor of a xerographic print engine. The throughput of such a laser-processing tool can be on the order of one semiconductor layer per second, which is a comparable printing speed to a low to medium range laser printer. The spot size (i.e., the average diameter D of openings 217, 217') determines the size of each ablated contact opening 217, 217'. This size is typically in the range of 5 to 50 microns in diameter.

In an alternative embodiment, laser-based non-contact patterning apparatus 240-1 includes a femtosecond laser. The advantage of using a femtosecond laser is that the laser energy can be focused to sufficient power that the electric field is strong enough to ionize the atoms in the passivation layer. This enables energy absorption in spite of the fact that the laser's photon energy may be less than the band gap energy of the dielectric passivation. Thus, passivation material can be ablated with less debris or finer debris. Debris that are generated can be removed by a stream of gas flow to prevent their redeposition onto the device.

Returning again to FIGS. 1 and 2, after patterning of first or upper passivation layer 215 is completed, device 211T2 is transported via conveyor 235 to a point located below direct metallization apparatus 250, where direct-write metallization apparatus 250 is utilized to deposit at least contact (metallization) portions 218 into each opening 217. Contact portions 218 facilitate electrical connection of current-carrying conductive (metallization) gridlines 219 to the diffusion regions formed in wafer 212. Upon completion of the metallization process by direct-write metallization apparatus 250, device 211T4 is heated by heater apparatus 260 to a setting temperature (e.g., 120° C. to 140° C.) to set the metal material deposited by the direct-write metallization apparatus 250. Thereafter, device 211T5 is flipped by flipper apparatus 270 and the second or back surface of device 211T6 is presented for processing by non-contact patterning apparatus 240', and device 211T7 is presented to direct-write metallization apparatus 250' for processing, each in a manner as previously described in connection with non-contact patterning apparatus 240 and direct-write metallization apparatus 250.

Next, device 211T8 is provided to optional wafer-off loading mechanism 280, which transports device 211T8 to post-metallization processing system 290. Thus, in this embodiment, openings 217', contact (metallization) portions 218', and current-carrying conductive gridlines 219', are formed in a manner similar to that as described in connection with the processing of the first or upper side of device 211T1-211T3. It is to be understood, however, even though the present embodiment employs similar processes on the front surface and back surface of device 211, this is not required. Also, the placement of openings 217, 217', contact portions 218, 218' and conductive gridlines 219, 219', do not need to have corresponding patterns and locations on each side of the device. Still further, the materials used for metallization on each side do not need to be the same. Rather, it is common to use different materials for the different sides.

Figure 7:
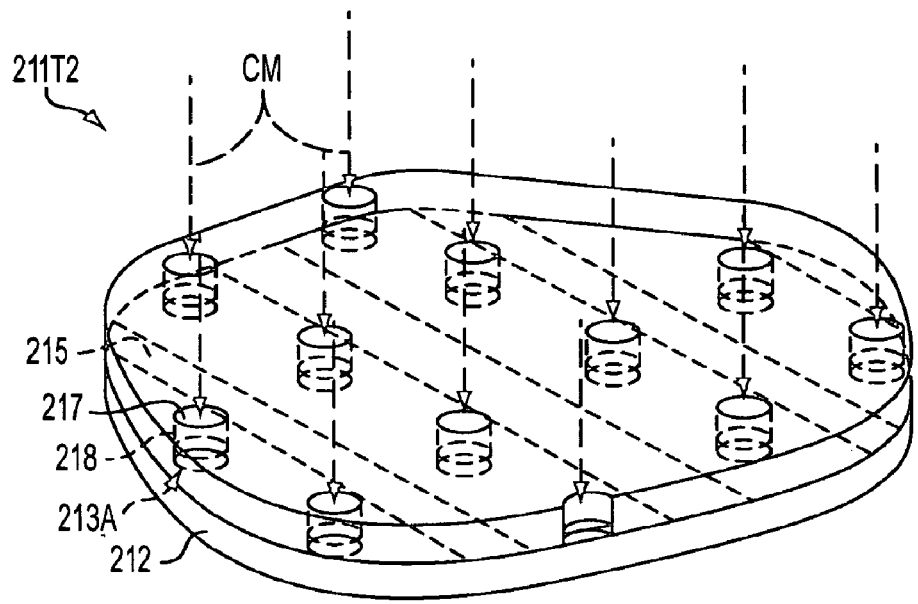
FIG. 7 is a perspective view showing a portion of a bifacial photovoltaic device during a first phase of a metallization portion of the production process of FIG. 1.
Figure 8:
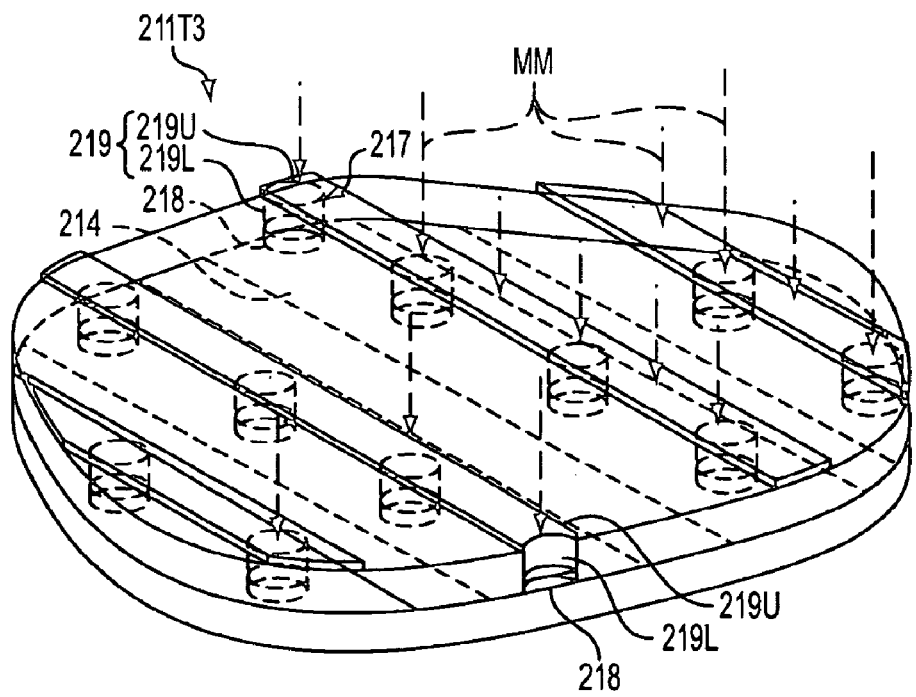
FIG. 8 is a perspective view showing a portion of a bifacial photovoltaic device during a second phase of the metallization portion.

Turning attention to FIGS. 7 and 8, the direct-write processing described above is illustrated. Particularly, FIG. 7 depicts the sequential deposition of contact material CM from direct-write metallization apparatus 250 into each opening 217 formed in passivation layer 215 such that contact portions 218 are formed directly on exposed portions 213A of substrate 212. Note that contact portions 218 do not necessarily fill openings 215. In accordance with another aspect of the present application, contact portions 218 include a silicide-forming metal that diffuses slowly in silicon. Specific examples of metals currently believed to be suitable for this purpose include nickel (Ni), cobalt (Co) and titanium (Ti). These metals are not only less expensive than silver but they are also demonstrated to enable a lower contact resistance by a factor of 30 or more. For the n-type emitter contact of the device, the metal may be selected from among the rare earth elements. These are known to form low barrier height electrical contacts to lightly doped n-type silicon. The ink or paste bearing the silicide forming metal may optionally contain a dopant such as phosphorous or boron to provide additional doping of the contact region during the thermal processing steps applied to the deposited metal. The ink or paste bearing the silicide forming metal may optionally contain nano-particles of metal. The small size of the metal particles improves both the dispersion of the particles in the ink and the reactivity with the silicon.

FIG. 8, illustrates the further processing of direct-write metallization apparatus 250, which includes a second deposition head or nozzle. This second deposition head or nozzle deposits a second (relatively highly conductive) metal MM into openings 215 to form a conductive plug 219L on contact portions 218, and optionally deposits the second metal on passivation layer 215 to form metal lines 219U in order to complete the production of current-carrying conductive lines 219. In accordance with an aspect of the application, second metal mm is different from contact metal CM (discussed above) in that, instead of being selected for its ability to form a silicide on silicon, second metal MM is selected for its electrical conductance, and as such typically has a greater electrical conductivity than contact metal CM. In one specific embodiment, second metal MM comprises copper, which is inexpensive and has excellent conductivity, and is also easily soldered. Note, however, that if copper is used as contact metal CM and allowed to diffuse into wafer 212, the copper will create recombination centers within the device, and these will degrade cell performance. Therefore, it is desired that each current-carrying conductive lines 219 include both a silicide contact structure 218 (e.g., nickel silicide) disposed at the silicon/metal interface, and a low resistance conductor 219L/219U (such as copper) formed on contact metal 218. In this case, the nickel silicide contact structure 218 also acts as a diffusion barrier to prevent poisoning of the silicon by the copper conductive plug 219L. A preferred source of Ni is ink composed of suspended particles of nanophase Ni. As mentioned above, the processing shown in FIGS. 7 and 8 in connection with an upper surface of a device is equally applicable to processing of the lower or back surface of device 211T5.

The immediate execution of metallization following the formation of contact openings 217 provides the additional advantage of limiting the air-exposure of exposed portions 213A. This short-duration exposure prevents the formation of an oxidized silicon layer that can otherwise interfere with the formation of the subsequently formed silicide (discussed below). Subsequent heating of the device after the set heating by heating apparatus 260, for example, during the post-metallization processing 290 of FIG. 2, drives off remaining volatile components of the ink or paste. Then a temperature cycle of the device, optionally located in a reducing ambient such as hydrogen or forming gas, completes the contact.

In an alternative embodiment of the present application, the direct-write metallization devices of the application may be utilized to print a seedlayer metallization material (e.g., Ni, Cu or Ag) inside each opening and in a predetermined pattern on the passivation layers to form one or more seedlayers. After removal from the conveyor, device is subjected to plating processes, whereby conductive lines are formed on seedlayers using known techniques. This embodiment provides an inherently self-aligned process particularly well suited to fabrication of bifacial solar cells. In a preferred embodiment, seedlayer metallization material would be jet printed, fired, and then plated with additional metal. It is to be appreciated that in order to form a bifacial cell, such processing is performed of both sides of the device.

In accordance with another aspect of the present application, the direct-write metallization apparatuses may be an inkjet-type printhead or an extrusion-type dispensing nozzle, as described in the following exemplary embodiments. By arranging such non-contact, direct-write metallization apparatuses immediately downstream of the non-contact patterning apparatus (described above), the present application enables the precise placement of metallization over the just-formed contact openings without an expensive and time-consuming alignment step.

Figure 9:
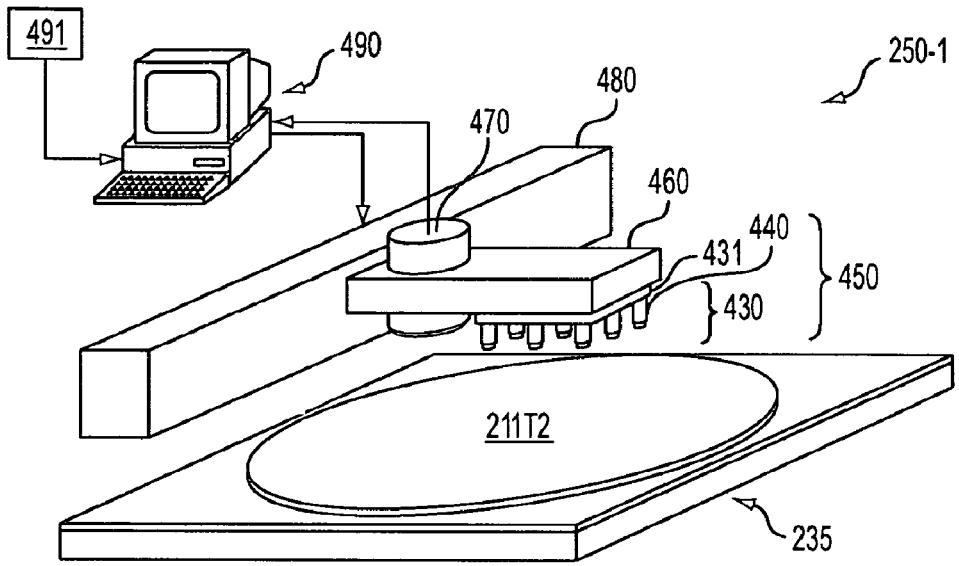
FIG. 9 is a perspective view showing an inkjet-type printing apparatus utilized during the metallization portion in accordance with the present application.

FIG. 9 is a perspective view of an inkjet-type printing apparatus 250-1 for printing contact structures 218 and conductive lines 219 in the manner described above according to an embodiment of the present application for both sides of the device (e.g., 211T2, 211T5). Such inkjet-type printing apparatus is disclosed, for example, in co-owned U.S. patent application Ser. No. 11/282,882, filed Nov. 17, 2005, titled "Extrusion/Dispensing Systems and Methods" with inventors David K. Fork and Thomas Hantschel, previously incorporated herein in its entirety. Printing apparatus 250-1 is mounted over conveyor 235 (partially shown), which supports device 211T2, (211T5) and includes a print assembly 450 mounted to a printing support structure 480, and a control circuit 490 (depicted as a computer/workstation).

Print assembly 450 includes a print head 430 and an optional camera 470 (having high magnification capabilities) mounted in a rigid mount 460. Print head 430 includes one or more ejectors 440 mounted in an ejector base 431. Ejectors 440 are configured to dispense droplets of the appropriate metallization material in a fluid or paste form onto device 211T2 in the manner described above.

Control circuit 490 is configured in accordance with the approaches described below to provide appropriate control signals to printing support structure 480. Data source 491 can comprise any source of data, including input from an in-line sensor (as described below), a networked computer, a pattern database connected via a local area network (LAN) or wide area network (WAN), or even a CD-ROM or other removable storage media. The control signals provided by computer/workstation 490 control the motion and printing action of print head 430 as it is translated relative to device 211T2.

Note that the printing action can be provided by printing support structure 480, by conveyor 235, or by both in combination. Computer/workstation 490 is optionally coupled to receive and process imaging data from camera 470. In one embodiment, camera 470 provides both manual and automated calibration capabilities for printing apparatus 250-1.

By properly calibrating and registering printing apparatus 250-1 with respect to device 211T2 the metallization pattern (e.g., contact portions 218 and metal portions 219L and 219U, described above with reference to FIG. 8) printed by printing apparatus 250-1 can be precisely aligned with openings 215 formed in passivation layer 215, thereby ensuring a high-yield manufacturing process. According to an embodiment of the application, apparatus calibration can be accomplished with a video camera microscope (such as camera 470) having an optical axis position that is fixed relative to the ejector positions of the print head. Of course, a printing apparatus such as the described printing apparatus 250-1, may also be used in processing device 211T5, i.e., the back surface.

Figure 10:
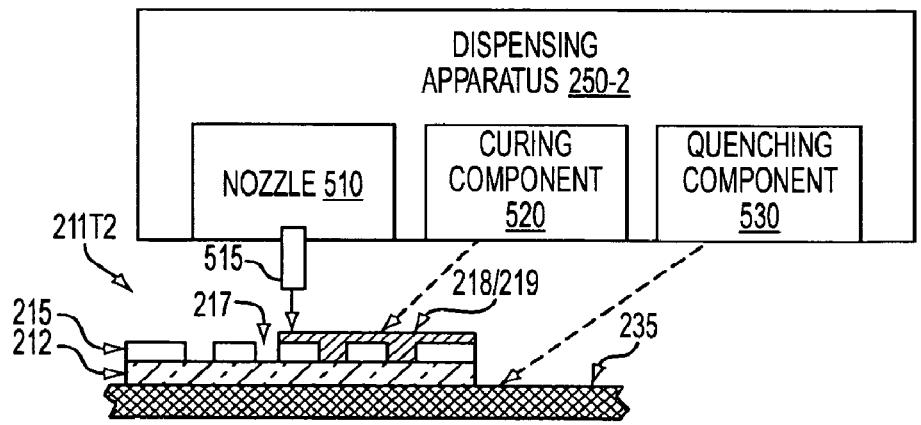
FIG. 10 is a simplified side-view diagram showing an extrusion-type dispensing apparatus utilized during the metallization portion in accordance with the present application.

FIG. 10 is a simplified side-view showing an extrusion-type dispensing apparatus 250-2 for printing at least one of contact structure 218 and conductive lines 219 onto wafer 211T2 in the manner described above according to another embodiment of the present application. Extrusion-type dispensing apparatus 250-2 is mounted over conveyor 235 (partially shown), which supports device 211T2, and includes a dispensing nozzle (applicator) 510, an optional curing component 520, and an optional quenching component 530. In one embodiment, dispensing nozzle 510 includes one or more openings 515, and is configured to concurrently apply two or more metallization materials (e.g., a silicide-forming metal paste and a high-conductivity metal paste) into openings 217 and over passivation layer 215 to form contact portions 218 and conductive lines 219. The materials are applied through pushing and/or drawing techniques (e.g., hot and cold) in which the materials are pushed (e.g., squeezed, etc.) and/or drawn (e.g., via a vacuum, etc.) through dispensing nozzle 510 and out one or more openings 515. Nozzle 510 can be micro-machined with various channels and structures that receive and converge individual materials. For instance, nozzle 510 can include N channels, where N is an integer equal to or greater than one, for merging materials within the nozzle 510 into a single flow dispensed through opening 515. Each of the N channels can be used for introducing a different material and/or multiple channels can be used for introducing a substantially similar material. Where nozzle 510 includes a single channel, the different material can be introduced through similar and/or different ports into the channel. Each channel can extend through a length (e.g., the entire length or a subset thereof) of nozzle 510. For instance, one or more of the N channels can be designed to be shorter than the length of nozzle 510, but relatively longer than an entrance length in order to produce laminar flow, wherein flow velocity is stabilized prior to merging materials. This can be achieved through known micro-machining techniques such as deep reactive ion etching, wafer bonding, etc.

Creating nozzle 510 for laminar flow mitigates and/or minimizes mixing of materials as the materials traverse through nozzle 510 and out of opening 515. The N channels may also be shaped to counteract the effects of surface tension on the materials as they progress from nozzle 510 to device 211T2.

Each channel may be uniquely and/or similarly shaped, including uniform and/or non-uniform shapes. Similar to the inkjet-type printing apparatus (discussed above), nozzle 510 may be moved over device 211T2 during dispensing of the materials in order to produce the desired metallization structures. Curing component 520 and/or quenching component 530 may be utilized to limit the tendency for the dispensed materials to intermix after extrusion. For example, curing component may be used to cure the dispensed materials by thermal, optical and/or other means upon exit from nozzle 510. Alternatively, quenching component 530 can be used to cool wafer 212, thereby cooling and solidifying the dispensed materials immediately after extrusion.

Of course, an extrusion type dispensing apparatus, such as extrusion-type dispensing apparatus 250-2, may also be used in processing of device 211T5, i.e., the back surface.

To further describe the exemplary embodiment of the extrusion concepts, attention is directed to FIG. 11, where the extrusion dispensing apparatus is shown with a dispensing nozzle 510-1 utilized to simultaneously deposit a contact (lower metal) layer (218A or 218B, as described below) on the surface of wafer 212 and/or passivation layer 215, and one or more conductive (upper) metal layers (219A or 219B) on contact layer 218A/B. In this example, the various layers of the gridlines are co-extruded high aspect ratio metals (e.g., in a range of 2:1 to 10:1, and sub-ranges within this range), which permit the coverage area of the metal material to be in a range of less than 10% to 4% of the total surface area of the device 211T8.

Figure 11:
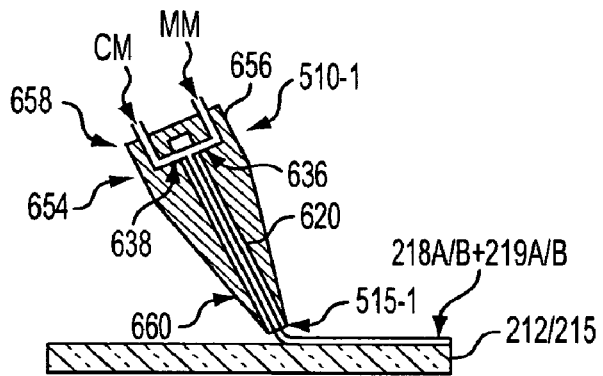
FIG. 11 is a cross-sectional side view showing an extrusion nozzle utilized during a metallization portion according to an embodiment of the present application.

FIG. 11 particularly illustrates nozzle 510-1 as having two or more different materials on wafer 212 and passivation layer 215. Nozzle 510-1 includes the manifold 620 that includes channels, which are fabricated to facilitate creating laminar flow in order to merge materials (i.e., contact material CM and metal material MM) received in each channel within the manifold 620 into a single flow of separate materials (with material to material contact) while mitigating mixing of the materials. The channels are associated with either ports 636 or ports 638, which are used to introduce the materials into the manifold 620. The two different materials are introduced into the manifold 620 in an interleaved manner such that adjacent channels are used for different materials. The materials traverse (e.g., via a push, a pull, etc. technique) through corresponding channels and merge under laminar flow within the manifold 20 to form a single flow of materials that are extruded through opening 515-1 onto wafer 212 or passivation layer 215.

Figure 12A:
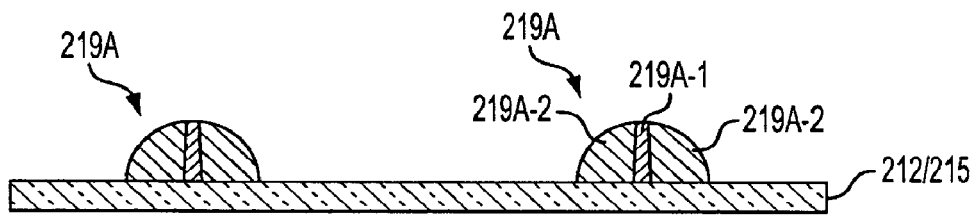
FIGS. 12(A) and 12(B) are cross-sectional side views showing gridlines formed on a photovoltaic device by the extrusion nozzle during the metallization separation according to an embodiment of the present application.

FIG. 12(A) is a cross-sectional end view showing a high aspect ratio gridline 219A that is extruded using nozzle 510-1 (FIG. 11) in accordance with an embodiment of the present application. Gridline 219A includes an elongated central metal structure 219A-1 having a relatively narrow width and a relatively large height (i.e., in the direction extending away from the passivation layer/wafer), and transparent supports 219A-2 formed on one or both sides of central metal structure 219A-1. In one embodiment, central metal structure 219A-1 includes a highly conductive metal such as copper, silver or aluminum, and transparent supports 219A-2 comprise a low melting glass optimized for its transparency and adherence to the device surface. Although not shown, a separate print head may be utilized to print a contact structure inside each contact opening before the extrusion of gridline 219A. The benefit of this structure is that it allows the production of bifacial solar cell devices that produce minimal interruption of sunlight passing into either side of the device. In one specific embodiment, contact portion 218A comprising a nickel bearing paste that is deposited at the gridline-substrate interface (i.e., in the contact openings and on passivation layer 215), and upper portion 219A consists of a more conductive metal such as copper, silver or aluminum. The particular metals being selected being dependent on the side of the bifacial device being processed.

Figure 12B:
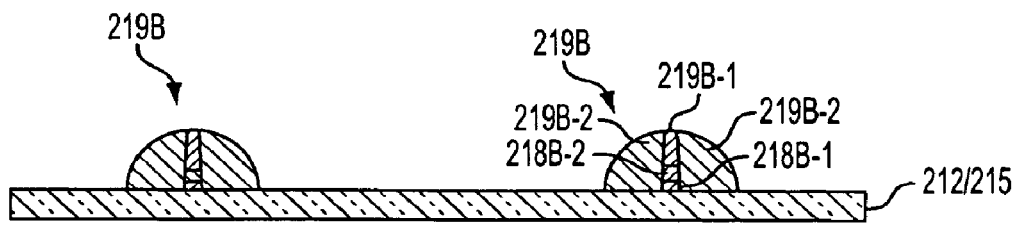

FIG. 12(8) is a cross-sectional end view showing another high aspect gridline 219B in accordance with another embodiment of the present application. Similar to high aspect ratio gridline 219A (described above), gridline 219B includes a high aspect ratio central metal structure 219B-1 and transparent supports 219B-2 formed on each side of central metal structure 219B-1. However, gridline 219B also includes one or more elongated contact metal layers 218B-1 and 218B-2 that are co-extruded simultaneously with and are located below central metal structure 219B-1 and transparent supports 219B-2. As described above, contact metal layers 218B-1 and 218B-2 include, for example a silicide-forming metal (or, after treatment, the silicide formed from such a metal).

Figure 13:
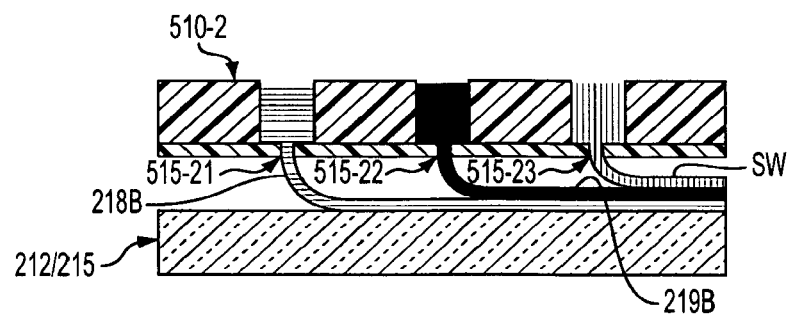
FIG. 13 is a cross-sectional side view showing a simplified extrusion nozzle and a multilayer gridline obtained during the metallization operation in accordance with an embodiment of the present application.

FIG. 13 is a cross-section showing a second nozzle 510-2 and a second gridline including a multi-layer stack formed by a contact forming metal portion 218B, a conductive metal portion 219B, and a solder wetting material SW. These materials are respectively extruded through openings 515-21, 515-22, and 515-23 in the manner depicted in FIG. 13. Any of these layers may serve a dual function, for example, copper is both highly conductive and can readily be soldered. As with other co-extruded structures, the complete extrusion may optionally include a transparent or sacrificial structure to the side or sides of the gridline to support its high-aspect ratio metal portion. In an embodiment using a sacrificial support structure, the support structure is burned away during firing of the metallization.

As set forth in the following exemplary embodiments, the processing methods described above may be modified to optimize the production of bifacial cell-type photovoltaic devices. Particularly, using direct-write metallization apparatuses as described herein, the metallized area (e.g., gridlines, bus bars, contact portions) of a surface can, as previously mentioned, be less than 10% to 4% of the total surface area of a device.

In one embodiment, the metallization applied over the contact openings by the direct write metallization devices described above (i.e., inkjet-type printing apparatus 250-1 and/or extrusion-type dispensing apparatus 250-2) may, after subsequent thermal processing, serve as the complete cell metallization in preparation for tabbing and stringing the cells for module assembly. Alternatives to tabbing may also be applicable, for example the adhesive bonding of the cells to a flexible backplane.

In another alternative embodiment, instead of linearly arranged contact openings 217, 217', continuous line openings (not shown) are formed by laser pulses LP that are used to provide contact between the gridlines and the N-type diffusion region.

Figure 14:
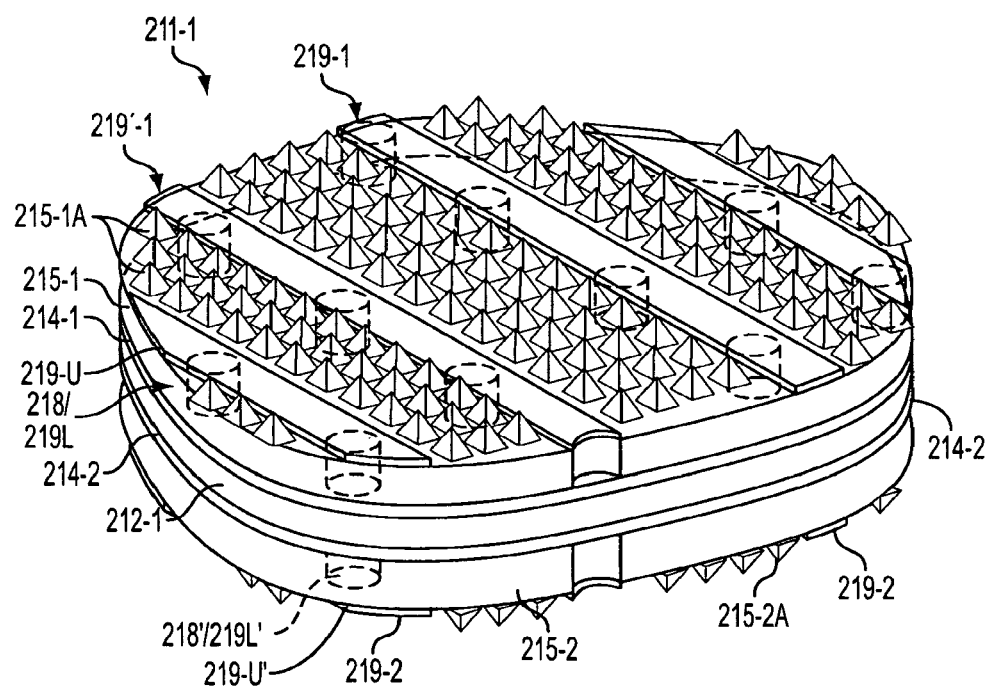
FIG. 14 is a perspective view showing a bifacial photovoltaic device produced in accordance with the present application.

Turning to FIG. 14, illustrated is a perspective view showing a bifacial type photovoltaic device 211-1 that is produced in accordance with an embodiment of the present application. Device 211-1 generally includes a P-type single crystalline silicon wafer (substrate) 212-1 disposed between a continuous N-type diffusion region 214-1, which is formed in an upper surface of wafer 212-1, and a continuous P-type diffusion regions 214-2 formed in a lower surface of wafer 212-1. Passivation layer 215-1 is formed over diffusion region 214-1, and passivation layer 215-2 is formed over diffusion regions 214-2. Pyramid-like light trapping structures 215-1A are formed on a surface of upper passivation layer 215-1 and pyramid-like light trapping structures 215-2A are formed on a surface of lower passivation layer 215-2, according to known techniques. In addition, current-carrying conductive gridlines 219-1 and 219-2 are, respectively, formed over passivation layers 215-1 and 215-2. Gridlines 219-1 and 219-2 are formed using any of the methods described above, e.g., to include a contact portion 218, 218', lower metal conductive plugs 219L, 219L', and metal gridline portions 219U, 219U'. Note that gridlines 219-1, 219-2 are typically narrow parallel metal lines that extend substantially across the surface of passivation layers 215-1, 215-2.

FIG. 14 is depicted as a p-pn junction device. It is to be appreciated, however, this construction is simply one example of a bifacial cell which may be constructed in accordance with the concepts of the present application. Particularly, the above description should not be considered to limit the types of bifacial cells which may be made in accordance with the present teachings. It is to be understood the present concepts are equally applicable to other solar cell structures (e.g., homojunction, heterojunction, p-i-n/n-i-p, multifunction). Additionally, while the present bifacial cell shows contact points on both sides of the cell, the concepts disclosed herein may also be used to produce a bifacial cell wherein the contacts are in a single side.

Turning to another aspect of the present application, and as previously mentioned, a large cost in the manufacture of a solar cell, is the cost of the semiconductor silicon layer. Therefore, it is desirable to employ as thin a semiconductor silicon layer as possible. In existing solar cells, the semiconductor layer is between 250 and 300 microns in thickness. However, due to the non-contact concepts of the present application, semiconductor layers of 150 microns to 100 microns, or even less, may now be considered for use.

Figure 15:
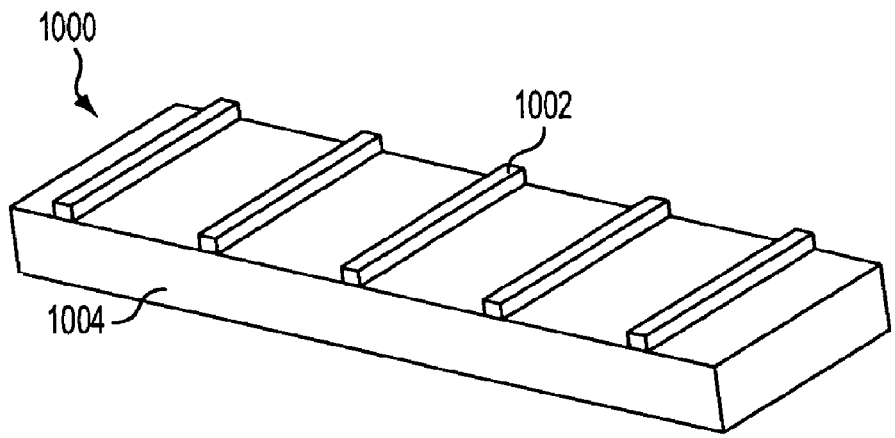
FIG. 15 depicts a side view of a single-sided cell with metallized gridlines.
Figure 16:
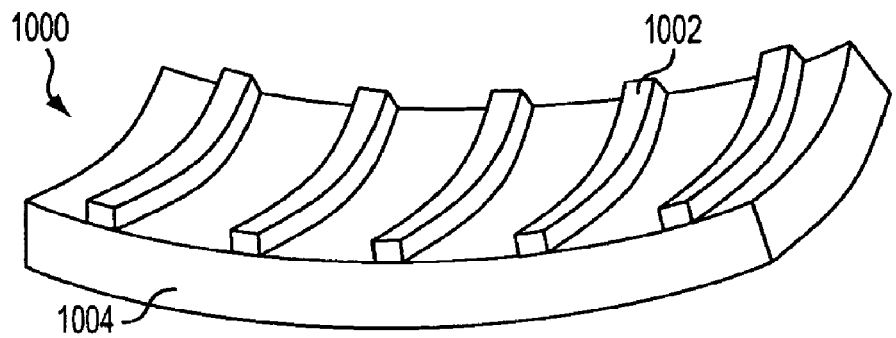
FIG. 16 depicts the concept of the solar cell of FIG. 15, having a bowed effect due to a mismatch of coefficients of thermal expansion between the wafer and gridlines.

However, when such thin semiconductor layers are attempted to be used, problems may occur. For example, for nearly all processing methods, including screen printing, as well as the above non-contact processing concepts, when a thin semiconductor silicon layer is employed in construction of a solar cell (such as a single-sided, square solar cell), an undesirable effect results. As shown in FIG. 15, single-sided, square solar cell 1000 has metal gridlines 1002 applied to a single surface. In this example, the coefficient of thermal expansion of the deposited gridlines 1002 is not matched to the coefficient of expansion for the semiconductor layer 1004. This results in a warping of the semiconductor layer 1004 (which may be a bowing or other deformation) such as shown in the top view of FIG. 16. Particularly, it is common for the edges of the semiconductor layer 1004 to pull up from a planar surface when the semiconductor wafer is too thin.

This effect will also occur for bifacial cells which have gridlines on each surface, since there will also be a mismatch of thermal expansion between the materials. For example, in existing bifacial cells, silver is commonly used on one surface (e.g., the top metallization), and aluminum is used on the other surface (e.g., the bottom metallization). In this instance, since aluminum and silver, as well as the silicon of the semiconductor layer, have significantly different coefficients of thermal expansion, the bifacial cell warps (e.g., bows) when a thin semiconductor layer is used (e.g., silicon of about 150 microns or less). Although, depending on the semiconductor layer type and metal material, bowing may occur for semiconductor layers thicker than 150 microns.

Figure 17:
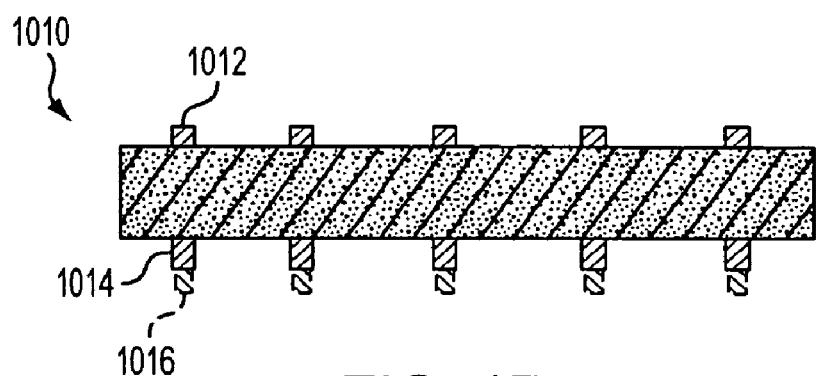
FIG. 17 depicts metallization on a solar cell, wherein the coefficients of metal expansion between metallization on a top surface and a bottom surface are equalized to eliminate the bowing of FIG. 16.

An aspect of the present application which addresses this issue, is to manufacture a bifacial cell to insure that the mechanical moments of the gridlines on the upper surface and the lower surface are equal. By matching the mechanical moments, the semiconductor layer itself can be made thinner than presently possible, while avoiding the warping effect. As shown by the bifacial cell 1008 of FIG. 17, semiconductor layer 1010 has a thickness of about 150 to 100 microns or less. Then the material(s) 1012 on the upper surface of semiconductor layer 1010 and the material(s) 1014 on the bottom surface of layer 1010 are selected to have coefficients of thermal expansion which sufficiently match, so counteracting forces are generated which sufficiently cancel each other out to permit the semiconductor layer to remain non-warped.

Use of the materials in the present application results in the difference in the coefficient of thermal expansion between the two sides to be sufficiently minimized so as to maintain the wafer non-warped. Alternatively, if metals of significantly different coefficients of thermal expansion are used on the different sides of the bifacial cell, for example, where silver might be used as the metal material on one surface and aluminum used as the other metal material, the present application provides a manner to even out the stresses. As depicted by dotted line layer 1018 in FIG. 17, a second layer of silver (or other appropriate metal) may be placed on top of the aluminum layer (e.g., 1014). The amount of layer 1016 is selected to ensure that the mechanical moments of the upper metallization (1012) are sufficiently equal to the bottom metallization (1014, 1016).

Silicon has a coefficient of thermal expansion of $2.8 \times 10^{-6}/° C$. The expansivity of most metals is substantially higher. Silver, which is the commonly used material for front emitter contact gridlines, has a coefficient of thermal expansion of $18.9 \times 10^{-6}/° C$. Aluminum, which is the commonly used material for the blanket collector metallization, has a coefficient of thermal expansion of $23.1 \times 10^{-6}/° C$. When the metal is fired at a temperature on the order of 850° C., it is either liquid in the case of aluminum, or it is softened. Stress accumulates during cooling from the firing temperature. The metal structures attempt to contract more than the silicon, and thereby develop a tensile stress. This occurs in existing cells which use a blanket layer of aluminum, because the aluminum layer covers nearly the entire back surface and is typically over 20 microns thick, and it has a much larger mechanical moment than the front surface metallization. This causes the silicon layer to bow toward the aluminum side. Given that the gridlines on the front surface of a typical screen printed semiconductor layer cover about 10% of the area, the mechanical moment of the silver metallization on the front is more than 10× smaller than mechanical moment of the aluminum metallization on the back. The bowing problem becomes more severe as the semiconductor layer becomes thinner.

On the other hand, since the present embodiments provide an improved contact structure on the back surface of the semiconductor layer, less contact area is needed, and therefore blanket metallization is unnecessary. By breaking the back surface metallization into gridlines and bus bars rather than a blanket layer, it will be appreciated that the quantity of metal can be reduced by over 90%. This has the desired improvement that the mechanical moments of the front and back layers are comparable. The present disclosure permits for the mechanical moments can be matched even closer by one or more of the following procedures: (1) The respective widths of the metallizations on each side of the semiconductor layer can be tailored to equalize the mechanical moments; (2) The respective thicknesses on each side of the semiconductor layer of the metallizations can be tailored to equalize the mechanical moments; (3) The respective volumes of the metallizations on each side of the semiconductor layer can be tailored to equalize the mechanical moments; (4) For multi-layer metallizations, for example on the backside of the semiconductor layer, one might use an aluminum-nickel-silver layered metallization to produce the desired matching mechanical moment to silver metallization on the front side of the semiconductor layer. Other ones of these embodiments take advantage of the fact that (a) if the lines on the front and back of the semiconductor layer are of primarily the same metal, e.g. silver, if the volumes are approximately equal, the mechanical moments will also be approximately equal and (b) silver is a better electrical conductor than aluminum. One method for producing the multilayer line is to employ vertical coextrusion described in U.S. patent application Ser. No. 11/282,882, filed on Nov. 17, 2005, and entitled, "Extrusion/Dispensing Systems and Methods."

Figure 18:
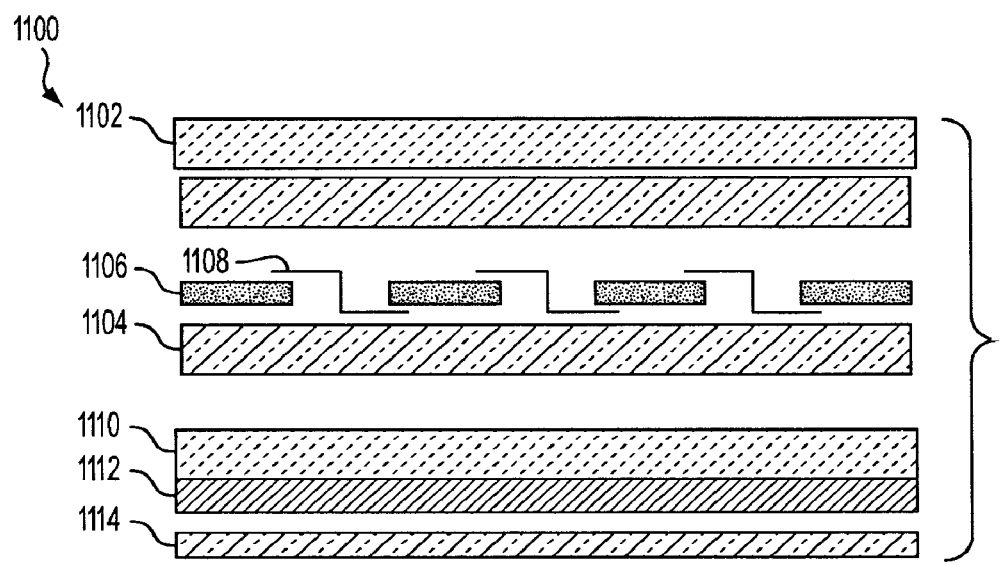
FIG. 18 is a simplified cross-sectional view of a bifacial photovoltaic device module containing multiple bifacial solar cells.

The individual solar cells constructed in accordance with the previously described processes are commonly incorporated in a bifacial photovoltaic arrangement such as a bifacial solar module shown in FIG. 18. Particularly, module 1100 of FIG. 18 includes a front surface or cover 1102, which may be a transparent layer such as glass or plastic. In one embodiment, the layer may be a modified ETFE (ethylene-tetrafluoroethylene) fluoropolymer such as Tefzel from El Du Pont de Nemours and Company of Wilmington, Del. (Tefzel is a registered trademark of El Du Pont de Nemours and Company). A layer of transparent lamination 1104, such as ethylene vinyl acetate (EVA) is provided on either side of a plurality of bifacial solar cells 1106 and interconnects 1108 connecting the bifacial solar cells 1106 in a cell string. Such a cell string may provide series, parallel or series parallel cell connection. A back surface includes a plastic or glass layer 1110, which carries a reflector 1112 on its outer surface. In one embodiment, reflector 1112 is a metallized mirror on glass or plastic layer 1110. In one embodiment, the metallized material may be a thin layer applied such as on mylar sheets. If, as in the present embodiment, reflector 1112 is on the outer surface of the plastic or glass layer 1110, the metallized mirror may be coated with a protective barrier 1114 for environmental stability. The protective barrier may be a variety of materials, including paint and/or a plastic laminate.

During the module forming process, the layers are compressed and heated to permit the plastic laminate 1104 to melt and solidify the layers into a single module.

With attention to reflector 1112, insertion of reflector 1112 permits light entering through front surface 1102, which passes through the module without being originally absorbed by bifacial solar cells 1106, or which do not actually pass through solar cells 1106, to be reflected to the back side surface of solar cells 1106, whereby efficiency in the collection and conversion of the light to electricity is improved. It is to be understood reflector 1112 is sized and positioned to reflect light to the bifacial solar cells throughout the module, where the module may include multiple solar cells extending in horizontal and vertical directions in the same plane. Thus, in one embodiment, the reflector will be capable of reflecting light to all or at least a majority of the backsides of the bifacial solar cells of the module.

Figure 19:
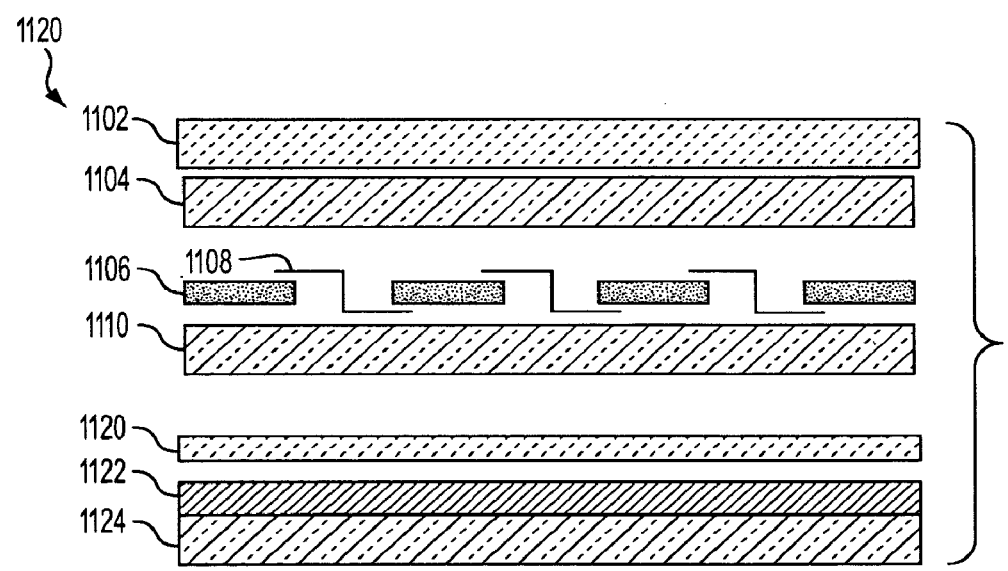
FIG. 19 is a simplified cross-sectional view of an alternative bifacial photovoltaic device module.

Turning to FIG. 19, illustrated is another embodiment of a bifacial photovoltaic module 1120. In this embodiment, front surface layer 1102, laminate layers 1104, solar cells 1106 and connectors 1108 are positioned similar to that as shown in FIG. 18. However, in this embodiment, a transparent insulator 1120 is provided between one of laminate layers 1104 and reflector 1122 carried on an inside surface of back side layer 1124, which may be plastic or glass. By this design, metallized mirror 1122, is separated from the array of solar cells 1106 by transparent insulating layer 1120 to prevent shorting of the cell string. The transparent insulating layer 1120 to selected to have a melting point higher than the other lamination materials (such as EVA), in order to prevent the solar cell strings from melting through and shorting to the mirror. Alternatively, the metallization may be patterned so that no conductive path exists from one cell to the next.

Figure 20:
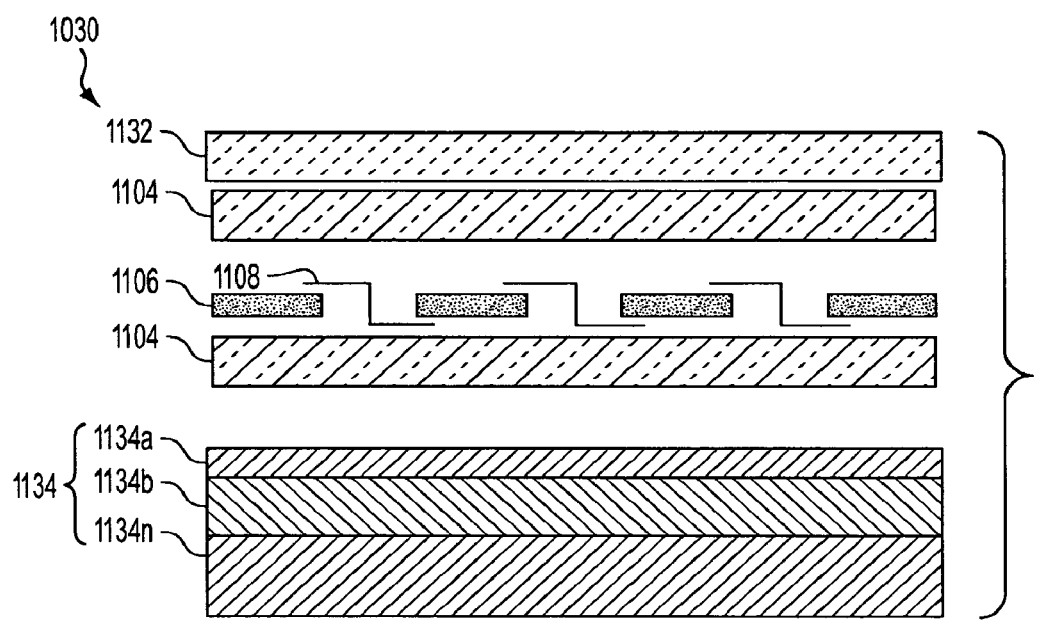
FIG. 20 is a simplified cross-sectional view of an alternative bifacial photovoltaic device module.

Turning to yet another embodiment, module 1130 of FIG. 20 is configured so front surface 1132 of module 1130 can be conventional glass, and the back surface 1134 is designed to consist of a single layer or multi-layer film, one surface of which is reflective. If the reflective surface is metallic, the same considerations apply as in the case of the glass substrate described above. The reflective surface may be made using multiple dielectric layers 1134a, 1134b, 1134n. In this case, the reflective surface is designed to transmit light having wavelengths which are not convertible by the solar cell into electricity. Specifically, in many instances, long-wavelength portions of the solar spectrum may not be absorbed by the various layers of the solar cell. Rather, if reflected to the solar cell, the long-wavelength portions will simply heat the solar cell to undesirable temperatures. It is known that the efficiency of cells degrade as they heat, where for approximately every 1° C. increase, there is a roll off in the efficiency. Thus, in this embodiment, the multiple dielectric layers function as a dichroic "cold mirror" to reduce the operating temperature of the module. In this design, only those wavelengths of the solar spectrum which have a capability of efficiently being transformed into electrical energy are reflected back to the back side of the solar cells 1106. When a dichroic mirror layer is part of the multi-layered structure, other layers of the system may be designed as transparent, to increase the long-term robustness of the module.

Additionally, the previously described bifacial cells may be configured to have the passivation layer configured as an amorphous silicon surface passivation against the crystalline silicon wafer to reduce recombination of the electrons and holes. Further, the metallization scheme will include a transparent conducting oxide (such as but not limited to ITO) on each side. Such a cell could be designed to be operationally similar to that of an HIT cell from Sanyo Corporation. In this design, the metal paste used for the structures on the solar cell will be a curable material with a cure temperature below 400° C. This enables forming the metal gridlines without removing the hydrogenation in the amorphous silicon. Such metal pastes are available from vendors such as Cermet, Inc. of Atlanta Ga.

With further attention to the embodiments of FIGS. 18-20, the reflectors may be Lambertian reflectors or specular reflectors. In another embodiment, the bifacial module may be designed with a plastic laminate front layer and a glass back layer.

Although the present application has been described with respect to certain specific embodiments, it will be clear to those skilled in the art that the inventive features of the present application are applicable to other embodiments as well, all of which are intended to fall within the scope of the present application. For example, although the description above is primarily limited to silicon-based photovoltaic devices, the various aspects of the present application may also be utilized in the production of photovoltaic devices on wafers formed by amorphous silicon, CdTe (Cadmium Telluride), or CIGS (copper-indium-gallium-diselenide), among others. In another example, although co-extrusion has been described as a procedure for obtaining high aspect ratio metal lines, other procedures such as mono-extrusion could be used where applicable. Also, the preceding may of course be used to manufacture a single-sided photovoltaic device.

We claim:

1. A method for producing a bifacial photovoltaic device, the photovoltaic device including a semiconductor layer, one or more doped regions, a first surface, a second surface, and a plurality of conductive lines disposed over the first surface and the second surface and contacting one or more doped regions at the first surface and the second surface, the method comprising:
    forming a blanket passivation layer on each of the first surface and the second surface of the semiconductor; and
    utilizing a direct-write metallization apparatus arrangement to deposit the plurality of conductive lines over the blanket passivation layer such that each of the plurality of conductive lines electrically contacts an associated doped region of the one or more doped regions the semiconductor layer,
    wherein utilizing the direct-write metallization apparatus arrangement to deposit the plurality of conductive lines further comprises forming said conductive lines such that all of said conductive lines cover less than 10% of the first surface and the second surface.

2. The method of claim 1, further comprising:
    utilizing a non-contact patterning apparatus arrangement to define a plurality of openings through the first passivation layer and the second passivation layer, each the openings exposing a corresponding one of the one or more doped regions of the semiconductor layer; and
    utilizing the direct-write metallization apparatus to deposit a plurality of contact portions into the plurality of openings such that each said contact portion is disposed in a corresponding opening of the plurality of openings,
    wherein utilizing the direct-write metallization apparatus arrangement to deposit the plurality of conductive lines comprises depositing each of the plurality of conductive lines over a corresponding group of said plurality of contact portions.

3. The method according to claim 1, wherein utilizing the direct-write metallization apparatus comprises utilizing an inkjet-type printhead.

4. The method according to claim 1, wherein utilizing the direct-write metallization apparatus comprises utilizing a dispensing nozzle.

5. The method according to claim 1, wherein utilizing the direct-write metallization apparatus to deposit the plurality of contact portions comprises depositing a silicide-forming metal into each of the plurality of openings.

6. The method according to claim 4, wherein utilizing the direct-write metallization apparatus further comprises depositing a second metal onto the silicide-forming metal disposed in each of the plurality of openings, wherein the second metal has a greater electrical conductivity than the silicide forming metal.

7. The method according to claim 1, wherein utilizing the direct-write metallization apparatus to deposit the plurality of contact portions comprises depositing a first silicide-forming metal in said openings formed through the first passivation layer and depositing a second silicide-forming metal in said openings formed through the second passivation layer, wherein the first silicide-forming metal differs from the second silicide-forming metal.

8. The method according to claim 1, wherein utilizing the direct-write metallization apparatus further comprises depositing a second metal onto the first silicide-forming metal disposed in said openings formed through the first passivation layer and depositing a third metal onto the second silicide-forming metal disposed in said openings formed through the second passivation layer, wherein the second metal differs from the third metal.

9. The method according to claim 1, wherein the semiconductor layer comprises at least one of crystalline silicon, amorphous silicon, CdTe (Cadmium Telluride), and CMS (copper-indium-gallium-diselenide).

10. The method according to claim 1, wherein utilizing the direct-write metallization apparatus arrangement to deposit the plurality of conductive lines further comprises forming said conductive lines such that each of said conductive lines has an aspect ratio exceeding 2:1.

11. The method according to claim 1, wherein utilizing the direct-write metallization apparatus arrangement to deposit the plurality of conductive lines further comprises matching a first mechanical moment of the conductive lines disposed over the first surface with a second mechanical moment of the conductive lines disposed over the second surface.

12. The method according to claim 11, wherein matching the first and second mechanical moments comprises forming the conductive lines such that a first coefficient of thermal expansion of said conductive lines disposed over the first surface sufficiently match with a second coefficient of thermal expansion of said conductive lines disposed over the second surface such that counteracting forces are generated by thermal expansion/contraction of said conductive lines disposed over the first and second surfaces.

13. The method according to claim 11, wherein matching the first and second mechanical moments comprises forming an associated layer over each of the conductive lines disposed over the first surface such a first stress generated by thermal expansion of said conductive lines and said associated layers disposed over the first surface is equal to a second stress generated by said conductive lines disposed over the second surface.

14. A method for producing a bifacial photovoltaic device, the photovoltaic device including a semiconductor layer having one or more doped regions, and opposing first and second surfaces, the method comprising:
forming a first blanket passivation layer on the first surface and a second blanket passivation layer on the second surface;
utilizing a direct-write metallization apparatus to form a plurality of first conductive lines that extend over the first blanket passivation layer and electrically contact associated doped regions of the one or more doped regions through the first surface; and
utilizing the direct-write metallization apparatus to form a plurality of second conductive lines that extend over the second blanket passivation layer and electrically contact associated doped regions of the one or more doped regions through the second surface,
wherein utilizing the direct-write metallization apparatus to form the plurality of first and second conductive lines further comprises forming said first and second conductive lines such that all of said first and second conductive lines cover less than 10% of the first surface and the second surface.

15. The method of claim 13, further comprising utilizing a non-contact patterning apparatus to define a plurality of first openings through the first passivation layer to the first surface and a plurality of second openings through the second passivation layer to the second surface, each the first and second openings exposing a corresponding one of the one or more doped regions of the semiconductor layer.

16. The method of claim 14, wherein utilizing the direct-write metallization apparatus to form the plurality of first conductive lines comprises:
utilizing the direct-write metallization apparatus to deposit a plurality of first contact portions into the plurality of first openings such that each said first contact portion contacts the first surface; and
utilizing the direct-write metallization apparatus to deposit the plurality of first conductive lines such that each said first conductive line contacts a corresponding group of said plurality of contact portions, whereby said each first conductive line is electrically connected to said corresponding one of the one or more doped regions by way of said corresponding group of said plurality of contact portions.

17. The method of claim 15, wherein utilizing the direct-write metallization apparatus to form the plurality of second conductive lines comprises:
utilizing the direct-write metallization apparatus to deposit a plurality of second contact portions into the plurality of second openings such that each said second contact portion contacts the second surface; and
utilizing the direct-write metallization apparatus to deposit the plurality of second conductive lines such that each said second conductive line contacts a corresponding group of said plurality of second contact portions, whereby said each second conductive line is electrically connected to said corresponding one of the one or more doped regions by way of said corresponding group of said plurality of second contact portions.

18. The method of claim 14,
wherein utilizing the direct-write metallization apparatus deposit the plurality of second contact portions comprises depositing a first silicide-forming metal in said plurality of first openings, and
wherein utilizing the direct-write metallization apparatus deposit the plurality of second contact portions comprises depositing a second silicide-forming metal in said plurality of second openings, wherein the first silicide-forming metal differs from the second silicide-forming metal.

19. The method of claim 14, wherein utilizing the direct-write metallization apparatus to deposit the plurality of first and second conductive lines further comprises matching a first mechanical moment of the first conductive lines with a second mechanical moment of the second conductive lines.

20. A method for producing a bifacial photovoltaic device, the photovoltaic device including a semiconductor layer having opposing first and second surfaces, the method comprising:
forming a first blanket passivation layer on the first surface and a second blanket passivation layer on the second surface;
utilizing a non-contact patterning apparatus to define a plurality of first openings through the first passivation layer to the first surface and a plurality of second openings through the second passivation layer to the second surface;
utilizing a direct-write metallization apparatus to deposit a plurality of first contact portions into the plurality of first openings and a plurality of second contact portions into the plurality of second openings; and
utilizing the direct-write metallization apparatus to deposit a plurality of first conductive lines such that each said first conductive line contacts a corresponding group of said plurality of first contact portions, and to deposit a plurality of second conductive lines such that each said second conductive line contacts a corresponding group of said plurality of second contact portions, wherein utilizing the direct-write metallization apparatus to deposit a plurality of first conductive lines further comprises forming said conductive lines such that all of said conductive lines cover less than 10% of the first surface and the second surface.

* * * * *